US005572042A

United States Patent [19]

Thomas et al.

[11] Patent Number: 5,572,042

[45] Date of Patent: Nov. 5, 1996

[54] INTEGRATED CIRCUIT VERTICAL ELECTRONIC GRID DEVICE AND METHOD

[75] Inventors: Michael E. Thomas, Milpitas; Irfan Saadat, Santa Clara, both of Calif.

[73] Assignee: National Semiconductor Corporation, Santa Clara, Calif.

[21] Appl. No.: 226,251

[22] Filed: Apr. 11, 1994

[51] Int. Cl.$^{6}$ ................................ H01L 29/06; H01J 1/02

[52] U.S. Cl. ............................ 257/10; 313/306; 313/309; 313/310

[58] Field of Search .............................. 257/10; 313/306, 313/309, 310

[56] References Cited

U.S. PATENT DOCUMENTS

| | | | |
|---|---|---|---|
| 3,755,704 | 8/1973 | Spindt et al. | 313/309 |
| 3,789,471 | 2/1974 | Spindt | 29/25.17 |
| 3,855,499 | 12/1974 | Yamada et al. | 315/169 |
| 4,578,614 | 3/1986 | Gray et al. | 313/309 |
| 4,721,885 | 1/1988 | Brodie | 313/576 |
| 4,766,340 | 8/1988 | Van der Mast et al. | 313/366 |
| 4,983,878 | 1/1991 | Lee et al. | 313/308 |
| 5,003,216 | 3/1991 | Hicks | 313/306 |
| 5,012,153 | 4/1991 | Atkinson et al. | 313/336 |
| 5,150,019 | 9/1992 | Thomas et al. | 315/350 |

OTHER PUBLICATIONS

Orvis, W. J. et al., Modeling and Fabricating Micro-Cavity Integrated Vacuum Tubes, IEEE Transactions on Electron Devices, vol. 36, No. 11, pp. 2651–2658 (Nov. 1989).

Orvis, W. J. et al., A Progress Report on the Livermore Miniature Vacuum Tube Projects IEEE, IEDM 89–529 (1989).

McConaghy, C. F., et al., Engineering Micro-Cavity Integrated Vacuum Tubes, International Vacuum Microelectronics Conference, Williamsburg, VA, Jun. 12–15, 1988, at p. 9–4.

*Primary Examiner*—Mark V. Prenty
*Attorney, Agent, or Firm*—Richard J. Roddy; William H. Murray; Robert E. Rosenthal

[57] ABSTRACT

An integrated circuit electronic grid device includes first and second metal layers wherein the metal layers are vertically disposed within a substitute. A layer of a dielectric medium is disposed between the metal layers and a third metal layer is spaced apart from the second metal layer and insulated from the second metal layer by another layer of a dielectric medium. The first and second metal layers are biased with respect to each other to cause a flow electrons from the first metal layer toward the second metal layer. The second metal layer is provided with a large plurality of holes adapted for permitting the flow of electrons to substantially pass therethrough and to travel toward the third metal layer. A fourth metal layer is spaced apart from the third metal layer to collect the electrons wherein the third metal layer is also provided with a large plurality of holes to permit the electrons to flow therethrough and continue toward the fourth metal layer. The third metal layer is coupled to a lead to permit it to serve as a control grid for modulating the flow of electrons.

21 Claims, 17 Drawing Sheets

INTEGRATED CIRCUIT VERTICAL ELECTRONIC GRID DEVICE AND METHOD

BACKGROUND OF THE INVENTION

1. Field of the Invention

This invention relates to the field of integrated circuit devices and in particular to integrated circuit having grid devices.

2. Background Art

Miniature, micrometer-sized vacuum tube devices, fabricated on a semiconductor wafer using integrated circuit fabrication techniques, are known. For example, miniature vacuum diodes and vacuum triodes are described in a paper entitled "Modeling and Fabricating Micro-Cavity Integrated Vacuum Tubes", William J. Orvis, et al., IEEE Transactions on Electron Devices, Volume 36, No. 11, November 1989, pages 2651–2658. An array of microelectronic tubes is disclosed in U.S. Pat. No. 4,721,885, issued Jan. 26, 1988 to Brodie. A split collector vacuum field effect transistor is disclosed in U.S. Pat. No. 5,012,153, issued Apr. 30, 1991 to Atkinson, et al.

These devices utilize a single point field emitter in conjunction with at least one grid having an opening which is spaced from and concentric with the point of the field emitter. In such devices, ion-bombardment damage or sputtering of the field emission tip can be a serious problem. Additionally, the usefulness of such devices is limited because of the low level of electron flow which is possible from the field emission tip. Furthermore, these devices, do to their configuration, require relatively large amounts of chip area.

Thus it is desirable to provide a way to obtain more reliable integrated circuit grid devices having inversed electron flow. One solution to this problem is the use of hot-electron thin film devices which are known in the art. For example, the "Handbook of Thin Film Technology", edited by Leon I. Maissel and Reinhard Glang, McGraw-Hill, Inc., 1970, discloses a tunnel-cathode emitter. The tunnel cathode is based on the fact that the electron energy is conserved during the tunnel process. Thus in tunneling from one electrode to the other, such that $eV<d_o$, the electrons enter the positively biased electrode with an energy level eV above the Fermi level of the electrode. The electrons then give up their energy to the lattice and fall into the Fermi sea.

For voltage biases such that $eV>d_o$, the electrons first tunnel into the conduction band of the insulator before entering the positively biased electrode. The electron is then assumed to be accelerated by the field within the insulator, without undergoing energy losses, to again enter the positively biased electrode with energy eV above the Fermi level. If eV is less than the positively biased electrode work function C, the electron gives up its energy to the electrode lattice as previously described. However, if $eV>C$ and less than the mean free path of the electrons, the electrons may pass through the electrode to the vacuum interface with little loss of energy, and thus escape into the vacuum.

It is thus believed that with a suitable geometry and voltage bias, a large fraction of the tunneling electrons should be able to escape from the tunnel junction into the vacuum and be collected by a suitably biased anode. The tunnel junction then, in principle, is a cold cathode. However, such cathodes are extremely inefficient, having transfer ratios typically on the order of $10^{-4}$ or $10^{-3}$ wherein the transfer ratio is understood to be the ratio of emission current to circulating current. These low values of the ratio of emission apparently result from the fact that the majority of electrons undergo energy losses while traveling in the conduction band of the insulator and the metal film. The attenuation of electrons appears to be directly related to the square of the thickness of the metal film.

It is also known to provide a tunnel-emission triode wherein a second insulator, assumed to be less than the electronic mean free path, and a third electrode are deposited onto the cold cathode. In the tunnel emission triode, the energy of electrons tunneling between the emitter and base electrode is assumed to be conserved when they reach the interface existing between the base and the second insulator. At this point electrons may not have sufficient energy to enter the conduction band of the second insulator. If the energy level is high enough electrons can enter the conduction band of the second insulator, in which case they are then accelerated toward and collected by the collector which is positively biased with respect to the base during operation. Thus the second insulator and collector serve the same function as the vacuum interspace and anode in the cold-cathode emitter.

However, the tunnel emission triode suffers from all the disadvantages of the cold cathode, plus additional problems arising from scattering and trapping in the collector insulator, which are not present in the vacuum interspace between the tunnel junction and anode comprising the cold cathode.

It is well known in the art that at high temperatures the properties of the semiconductor materials which form the semiconductor integrated circuits change, causing devices to operate improperly. It is known in the art to cool such devices in order to maintain their performance under conditions in which their temperature would be raised above the operating limit. This permits these devices to be operated with more watts per square centimeter than a similar circuit without cooling. However, the cooling of these integrated circuit devices can be a serious drain on resources and a serious limitation on what can be accomplished using these chips.

It is also known in the art that semiconductor devices are sensitive to transient radiation because of bulk generation of charge carriers in the active regions of these devices. For example, alpha particles can cause a charge which can latch up a device. These charge carriers tend to negate the topology of transitions and render them inoperable for the duration of the transient.

It is also known in the art to use a silicon micro-machining procedure to fabricate micro-cavity integrated vacuum tubes. This procedure can be performed with known integrated circuit processing equipment. The cathode, grid and anode of the vacuum tube is fabricated using planner technology so that the interconnection of many devices can be easily achieved. Low temperature chemical deposited oxide is used to separate the grid from the cathode and to separate the anode from the grid. Low temperature chemical vapor deposited oxide is also used as a sacrificial layer to etch cavities in the area of the field emitting points. Grid openings of a micron and registration accuracy between layers of 0.1 micrometers have been achieved. These devices use field emission rather than thermionic emission to generate charged carriers. All this is useful because miniature vacuum tubes are more radiation and temperature tolerant. This is useful in fission reactors, fusion reactors, and accelerators having instrumentation, control, and power conditioning electronics which are subjected to high temperatures and radiation fields.

These devices consist of a silicon field-emission pyramid on a silicon substrate. The pyramid is created by anisotropic etching of silicon. The field emitter is buried in the layer of phosphorous-doped silicon dioxide glass which is reflowed to make it more planer. Above the glass a pattern strip of doped polysilicon is deposited. The strip has a hole in it centered over the field emitter. In this device ion-bombardment damage or sputtering of the field emission tip is a serious problem. Additionally, the usefulness of these devices is limited because of the low level of electron flow which is possible from the field emission tip. Furthermore, voltages on the order of 50 volts to 150 volts are required to operate these devices.

SUMMARY OF THE INVENTION

An integrated circuit electronic grid device includes a thick oxide layer formed over a semiconductor substrate. A metal layer is formed over the thick oxide layer. A layer is formed over the metal layer. A depression is formed through the and metal layers into the thick oxide layer. The depression can be either in the form of a trench or it can be substantially cylindrical in form. A metal is deposited into the depression and etched back to leave a layer of metal on the wall of the depression which contacts the metal layer formed over the thick oxide layer. A dielectric is deposited conformally in the depression and etched back anisotropically. A permeable electrode material is then deposited over the structure and into the depression. The permeable electrode material is then patterned and etched to form a grid within the depression with at least a portion of the metal extending out over the top of the depression to which electrical contact can be made. A dielectric is then deposited over the permeable electrode material. A second metal deposition is performed which fills the depression and extends over the patterned dielectric.

DETAILED DESCRIPTION OF THE INVENTION

Figure 1B:
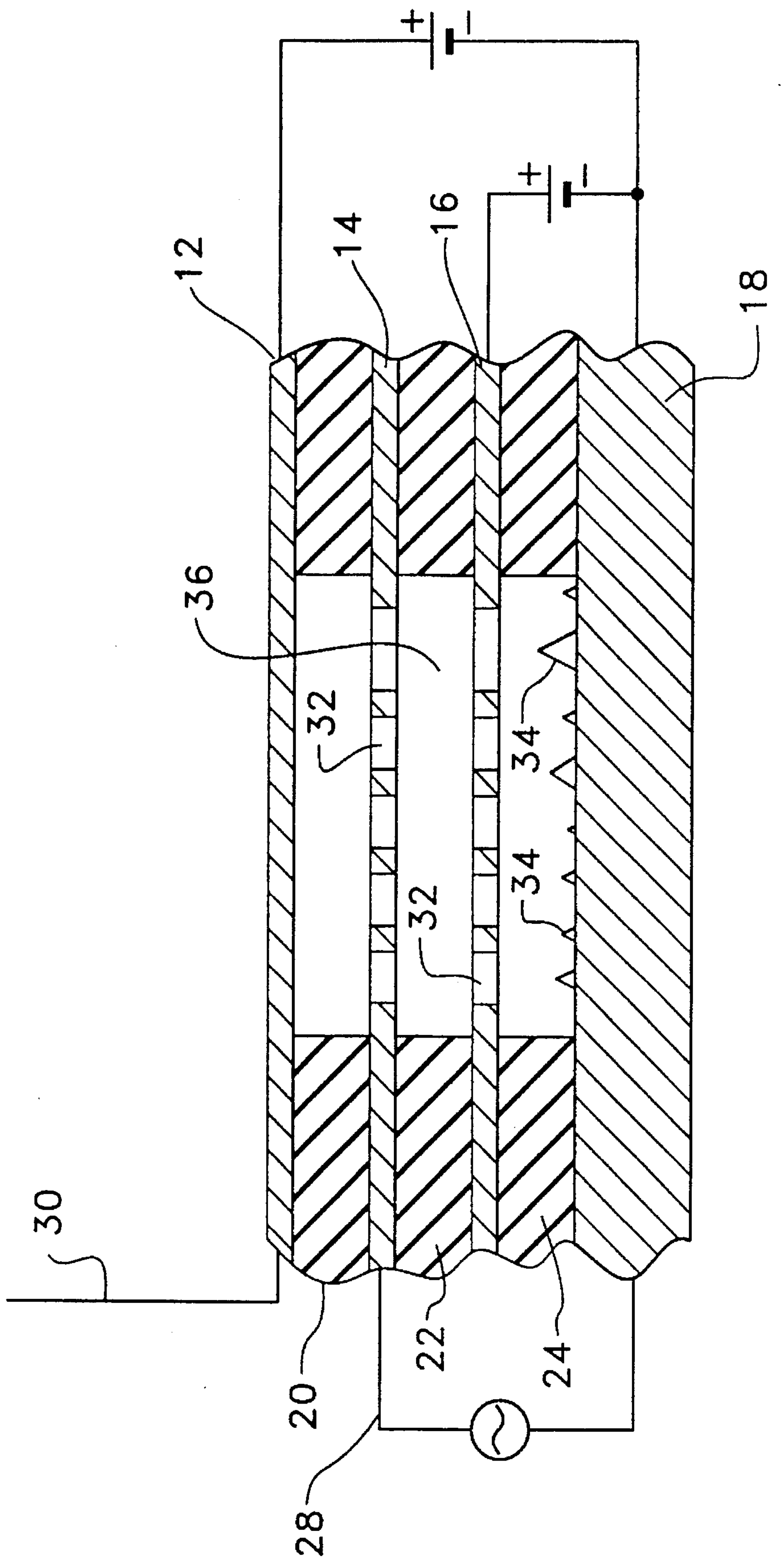
FIGS. 1A, B show the integrated circuit electronic grid device of the present invention.
Figure 1A:
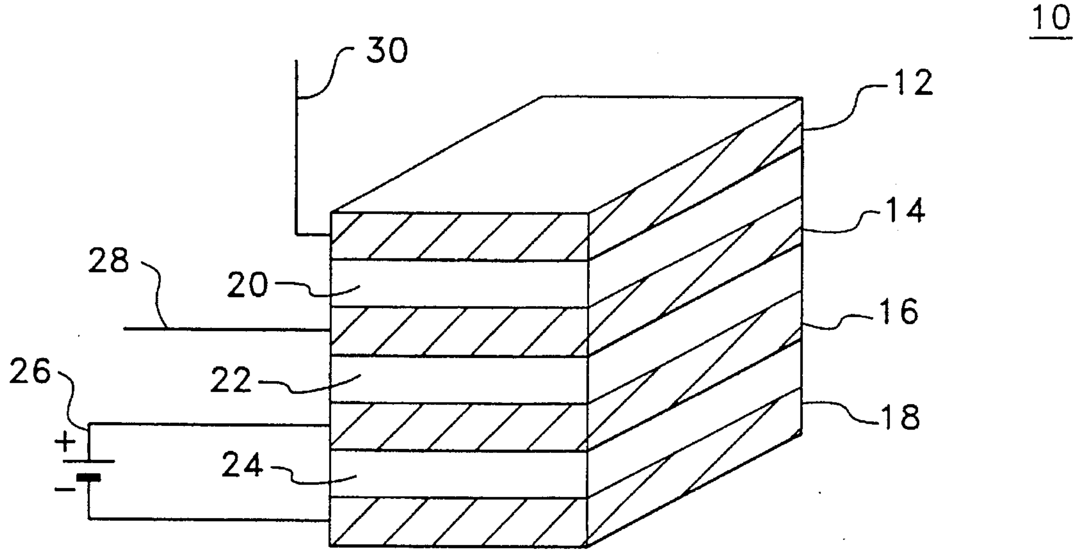

Referring now to FIGS. 1A,B, there is shown an embodiment of the integrated circuit horizontal electronic grid device 10 of the present invention. Integrated circuit horizontal electronic grid device 10 is formed of four metal layers 12, 14, 16 18 separated by three layers 20, 22, 24 of a dielectric medium such as a vacuum, air, or silicon dioxide. In an alternate embodiment, integrated circuit horizontal electronic grid device 10 may be provided with a plurability of further metal layers (not shown) separated by further dielectric layers (not shown) wherein the further layers may alternate as set forth for metal layers 12, 14, 16, 18 and layers 20, 22, 24 of dielectric medium. Structurally, integrated circuit horizontal electronic grid device 10 is substantially similar to a capacitor, formed of metal layers 12, 18, with two thin conducting plates 14, 16 between metal layers 12, 18.

Figure 2:
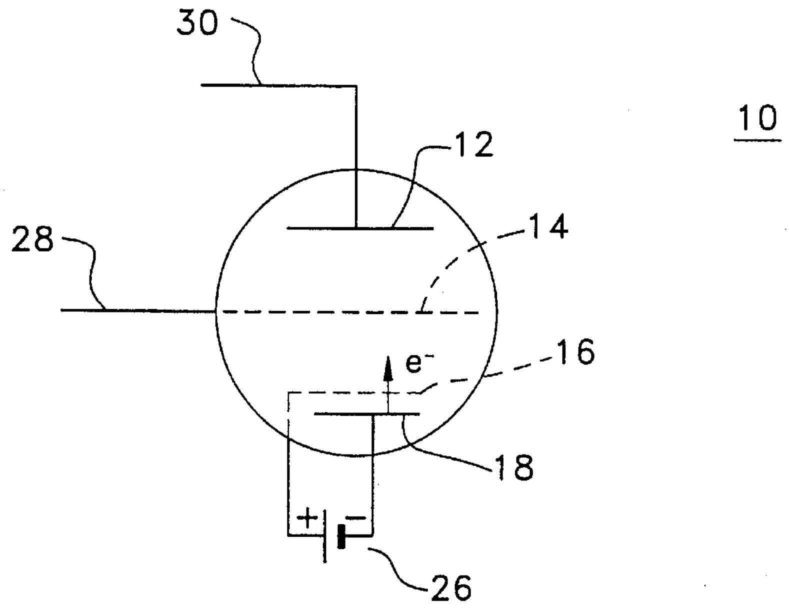
FIG. 2 shows a schematic representation of the integrated circuit electronic grid device of FIGS. 1A, B.

Referring now to FIG. 2, there is shown a schematic representation of integrated circuit horizontal electronic grid device 10. Metal layer 16 of integrated circuit electronic grid device 10 is biased positive with respect to metal layer 18 by direct current voltage source 26. The positive biasing of metal layer 16 with respect to metal layer 18 starts a field emission upward from metal layer 18 or electrode 18 toward metal layer 16 or emission grid 16. This causes electrons from the surface of metal layer 18 to pass through dielectric layer 24 by a tunneling process. A voltage potential of approximately five to ten volts between metal layer 16 and metal layer 18 produces a strong enough field to provide the electron tunneling required for electrons to pass through dielectric layer 24 if the distance between metal layer 16 and metal layer 18 is small enough. However, potentials of hundreds of volts may be used. In any event the operating voltage is well below the operating voltage of single emitter semiconductor diode devices.

Emission grid 16 is adapted to permit the electron flow through dielectric layer 24 to pass through emission grid 16 by providing emission grid 16 with a large number of holes 32. The electrons which pass through holes 32 of emission grid 16 then continue upward through dielectric layer 22 by the same tunneling process which occurs through dielectric layer 24. Thus integrated circuit grid device 10 may serve as a basic rectification device.

Control grid 14 is provided with a large number of holes 32 in a manner similar to that described for emission grid 16 in order to permit a flow of electrons through control grid 14. The electrons therefore pass through holes 32 of control grid 14 and then pass through dielectric layer 20, again by tunneling. After passing through dielectric layer 20 the electrons reach metal plate 12 if metal plate 12 is also provided with a positive bias.

Metal layer 14 or control grid 14 can thus modulate or control the electron flow from electrode 18 through grid device 10 to plate 12. An external control signal or modulation signal for controlling or modulating grid device 10 can be applied to control grid 14 by way of external control coupling line 28. After passing through dielectric layer 20 to electrode 12 or plate 12, the electrons are collected at plate 12 by way of line 30. Thus integrated circuit electronic grid device 10 may function in a manner similar to a vacuum tube with a cold cathode emitter and a signal can be amplified by integrated circuit electronic grid device 10 by applying the signal to control grid 14. Device 10 may be formed into a triode, a quatrode and so on by providing further control grids (not shown). Additionally, integrated circuit electronic grid device 10 can function as an amplifier or as a switch.

It is essential that emission grid 16 and control grid 14 both be formed with a very large fractional area of holes 32 through them in order for the liberated electrons to have higher transmission through emission grid 16 and control grid 14. More particularly, the ratio of the number of holes 32 to the surface metal area of emission grid 16 and control grid 14 must be maximized while assuring that the metal areas are continuously electrically coupled at all points within grids 16, 14.

The area of holes 32 may be in excess of fifty percent of the area of emission grid 16 and control grid 14 to permit electrons to pass therethrough. Preferably seventy percent to eighty percent of the surface area of grids 16, 14 should be the area of holes 32. Furthermore, emission grid 16 and control grid 14 should be as thin as possible, one thousand angstroms or less, to minimize electron capture by the metal of the grid layers. However, it is believed that the thicknesses of grids 14, 16 may be several thou sand angstroms. All metal layers 12, 14, 16, 18 of integrated circuit electronic grid device 10 may be formed of a substantially high temperature resistant metal such as tungsten, alloys of tungsten, or other refractory metals or alloys. The holes of grids 14, 16 do not necessarily have to be aligned with respect to emitters 34.

The forming of a large number of holes 32 through emission grid 16 and control grid 14 can be accomplished in a number of ways. A two-phase metal film can be formed by deposition and phase segregation at elevated temperatures on dielectric layers 22, 24 to control grid 14 and control grid 16. A metal matrix is thereby formed on the dielectric due to the presence of the two metals within the two-phase film. A secondary phase of the two-phase metal is then etched from the metal matrix of the film. This causes the metal film to be provided with a large number of holes 32 while keeping the metal electrically continuous over its entire surface because a conducting metal matrix remains when the second phase is etched away. While it is believed that a two-phase film is preferred, it will be understood by those skilled in the art that a one-phase film or other multi-phase films may be used.

Another way that emission grid 16 and control grid 14 may be formed with a large number of holes 32 is by randomly removing metal of a thin metal film deposition using a fine spray which locally attacks and removes small areas of metal from the metal film deposition. Additionally, holes 32 for grids 14, 16 can be formed in a process wherein the metal film depositions for control grid 14 and emission grid 16 are heated to a temperature high enough to make them agglomerate. Regions of the thin film can then be etched away. Furthermore, other techniques, such as standard lithographic techniques, can also be used.

For one square micron plates 12, 18, it would be desirable to form hundreds to thousands of holes 32 in emission grid 16 and control grid 14 between metal plates 12, 18. This would require that the average size of holes 32 in emission grid 16 and control grid 14 be reduced to below one hundred angstroms in diameter. Further, with respect to dielectric layers 20, 22, 24, these layers can be formed of polycrystalline material rather than monocrystalline material thus removing a number of design restrictions and avoiding crystalline perfection requirements.

In addition to providing emission grid 16 and control grid 14 having a maximum number of holes in relation to the surface area of the thin film forming grids 14, 16, another crucial factor for providing an electron flow from electrode 18 which can be modulated using control grid 14 and collected from plate 12 is a good field emission interface at the surface of electrode 18. A good field emission interface is necessary so that when emission grid 16 is biased positive with respect to electrode 18, a good source of electrons is emitted from the surface of electrode 18 into dielectric layer 24. The emitting interface of electrode 18 in contact with the surface of dielectric layer 24 can be made to release electrons more easily by roughening it atomically thereby creating a large number of microscopic emitters 34 for emitting electrons from the surface of metal layer 18 into layer 24 of dielectric medium. Providing a large number of emitters 34 for emitting electrons greatly increases the amount of current through dielectric layer 24. A further increase in electron emission can be achieved by heating electronic grid device 10. The emitting interface of electrode 18 can also be roughened to provide emitters 34, for example, by heating electrode 18 in ambient oxygen and then reducing the surface of electrode 18 by heating electrode 18 in hydrogen gas.

With respect to dielectric layers 20, 22, 24, these layers should be very thin to minimize scattering of electrons with ions as the electrons ballistically propagate through dielectric layers 20, 22, 24. The distances between metal layers 12, 14, 16, 18 should therefore be reduced preferably to between three hundred and four hundred angstroms. Dielectric layers 20, 22, 24 may be formed of any suitable dielectric medium. Dielectric layers 20, 22, 24 may be air region 31 or vacuum region 31, —or a partial vacuum region 31 when metals layers 12, 14, 16, 18 are separated, for example, by small regions of a supporting material such as a semiconductor dielectric like silicon nitride. Additionally, dielectric layers 20, 22, 24 may be a conventional semiconductor dielectric such as silicon dioxide. Semiconductor dielectric layers 20, 22, 24 may be simultaneously etched to provide air dielectric layers 20, 22, 24. One or more dielectric layers 20, 22, 24 may be formed of a substantially high temperature resistant material such as silicon dioxide. Maximum radiation hardening occurs when dielectric layers 20, 22, 24 are vacuum layers.

If electrons emitted from emitters 34 of the surface of electrode 18 when emission grid 16 is positively biased with respect to electrode 18 acquire a velocity of one one-hundredth of the speed of light, wherein the mean free path of electrons may be on the order of greater than a few microns, then transit times on the order of one picosecond or less may be achieved. Thus integrated circuit electronic grid device 10 can achieve large electron velocities and short transit times. Integrated circuit electronic grid device 10 can thus be used to make a very high speed device.

Integrated circuit electronic grid device 10 of the present invention may be formed of substantially high temperature resistant materials in order to provide high efficiency operation. For example, as previously described, all metal layers 12, 14, 16, 18 of integrated circuit electronic grid device 10 may be formed of a substantially high temperature resistant metal such as tungsten or other refractory metals. One or more dielectric layers 20, 22, 24 may be formed of substantially high temperature resistant material such as silicon dioxide or other refractory dielectrics. Thermal energy may then be applied to integrated circuit electronic grid device 10 causing an increased supply of electrons to be emitted from thermionic emission grid 16. This increased supply of electrons causes an increase in the efficiency of operation of integrated circuit electronic grid device 10. Because the performance of integrated circuit electronic grid device 10 improves at higher temperature, integrated circuit electronic grid device 10 has extremely good thermal characteristics and does not have to be cooled when used in operations which cause a very high density of watts per square centimeter. It is believed that the temperature range of such a high temperature resistant electronic grid device 10 is approximately five hundred degrees Centigrade to one thousand degrees Centigrade.

Referring to FIGS. 3A–F, there is shown, in diagrammatic cross-sectional view, various stages of fabrication of integrated circuit vertical electronic grid device 40 in accordance with a preferred embodiment of the present invention wherein the grid device is formed in a trench above the surface of a semiconductor substrate. It will be understood by those skilled in the art that integrated circuit vertical electronic grid device 40 is an alternate embodiment of integrated circuit horizontal electronic grid device 10.

A thick layer 42 is formed over a silicon substrate 44. First metal layer 46, preferably comprising tungsten, is formed over layer 42. In the preferred embodiment of grid device 40, tungsten layer 46 is formed using chemical vapor deposition as is known in the art. Layer 48, comprising silicon nitride is then formed over metal layer 46.

Figure 3A:
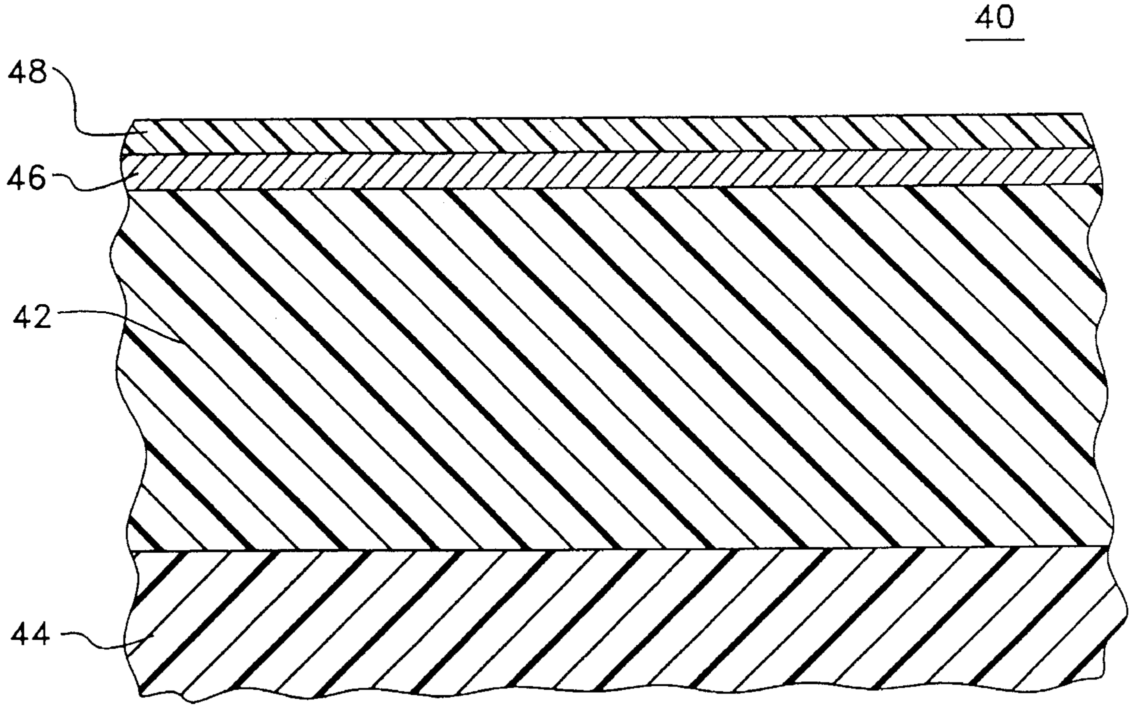
FIGS. 3A–G depict diagrammatic cross-sectional views of stages of fabrication of an alternate embodiment of the integrated circuit electronic grid device of FIGS. 1A, B in accordance with the present invention where a depression is in the form of an elongated trench and a permeable electrode therein.
Figure 3B:
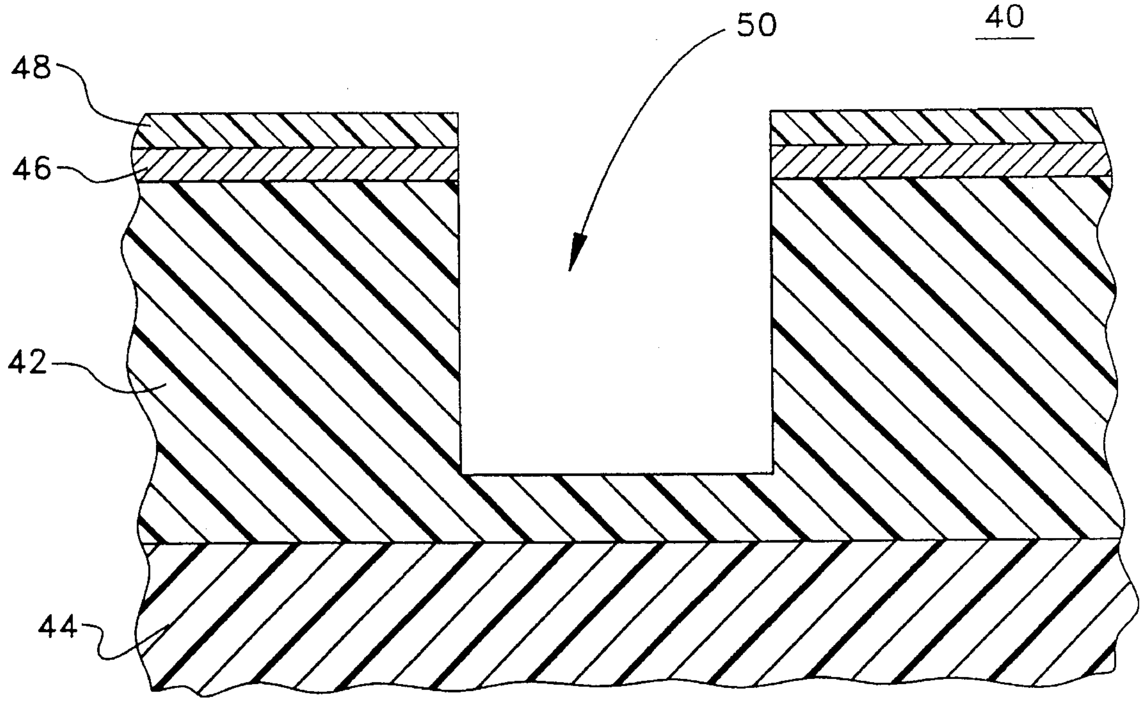

Referring now to FIG. 3B, vertical grid device depression 50 or trench 50 is formed into layer 42 through metal layer 46 and layer 48. In a preferred embodiment of the present invention, depression 50 is in the form of a trench as depicted in FIG. 3B–F. In an alternate preferred embodiment, depression 40 has a substantially cylindrical shape as depicted in FIG. 4A–F.

Figure 3C:
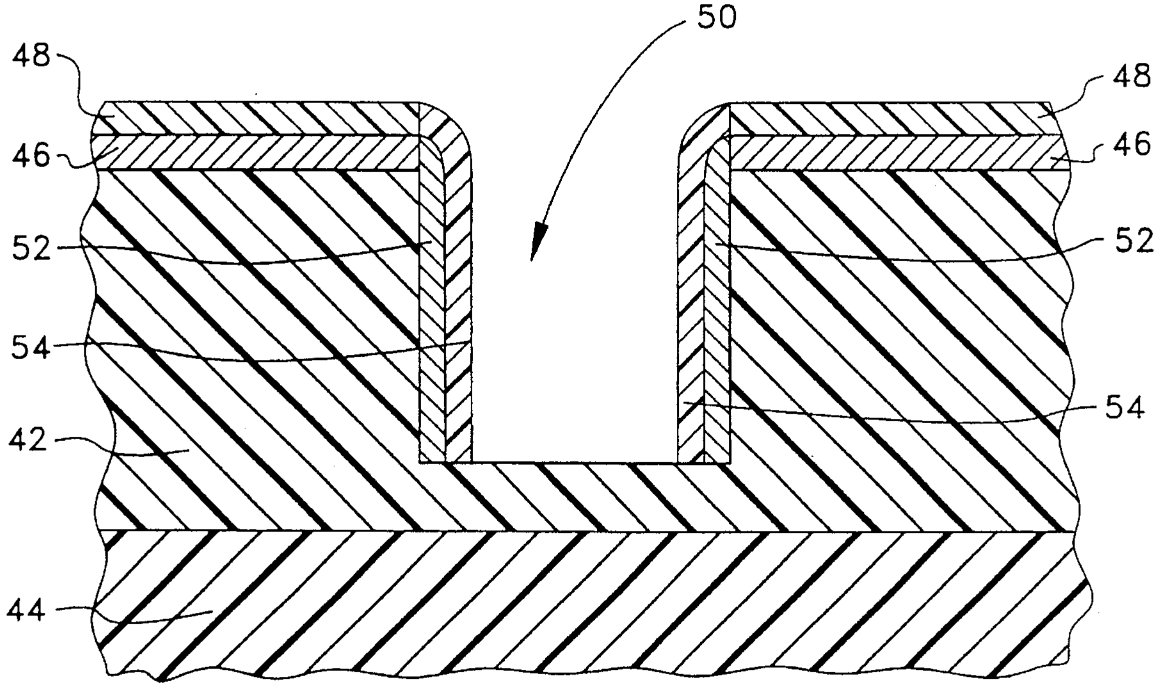

Referring now to FIG. 3C, second metal layer 50, preferably tungsten, is deposited over the structure preferably by chemical vapor deposition as is known in the art. Second metal layer 50 is anisotropically etched back leaving metal portions 52 of originally disposed metal layer 42 on the side walls of vertical grid device depression 50. Metal portions 52 extend upwards and into electrical contact with the metal layer 46.

Insulating layer, preferably $SiO_2$ is conformally disposed over the structure as is known in the art. The insulating layer is anisotropically etched back preferably using as is known in the art, leaving insulating layers 44 formed over the second metal layers 22 on the side walls of the vertical grid device trench 50. Insulating layers 24 extend from the bottom of the trench 50 to the top, covering the underlying metal layers 44.

Figure 3D:
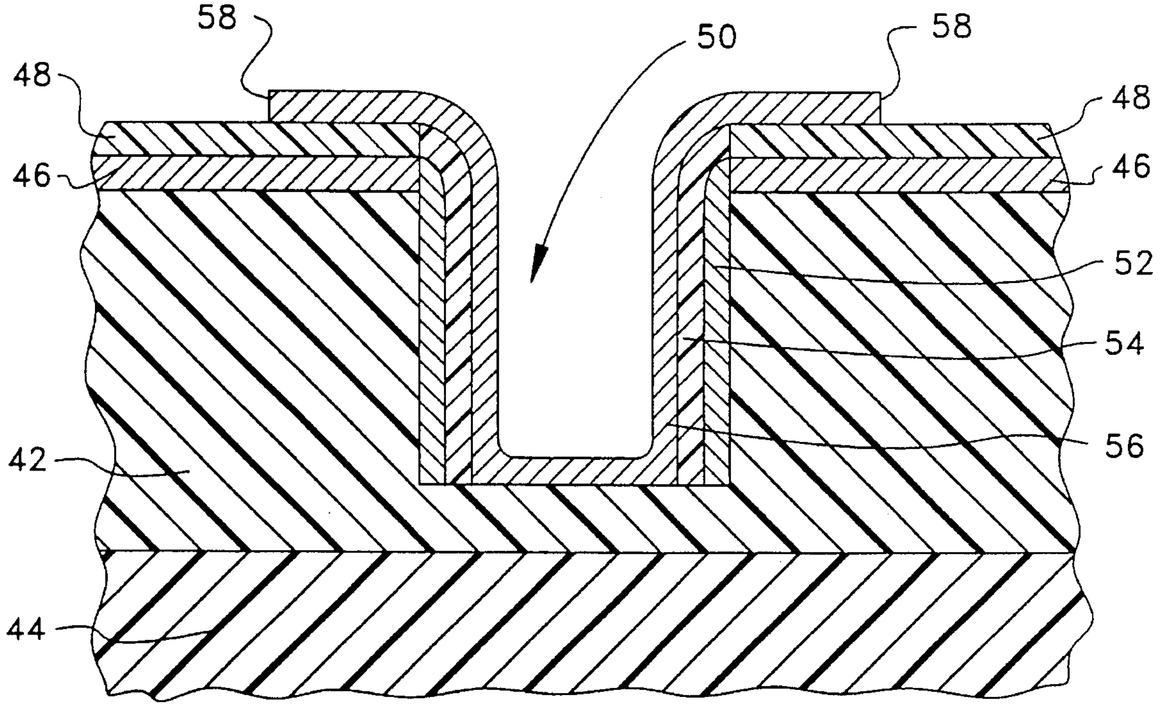

Referring now to FIG. 3D, permeable electrode 46 is formed in vertical grid device trench 50 over insulating layer 44, permeable electrode 46 extends from the bottom of trench 50 upward and out over the top of the trench 50 to form tabs 48 to which electrical contact can be subsequently made. Permeable electrode 46 may be formed by depositing a layer of 50% aluminum-50% silicon alloy, as is known in the art. Layer 46 is then heated, in order to form silicon islands in an aluminum matrix. The silicon islands are then selectively etched thereby leaving voids 60 in the aluminum matrix 62 as schematically depicted in FIG. 3G. The aluminum matrix 62, having voids 60 therein, may form the permeable electrodes 56 which permit electrons to travel therethrough from cathode to anode as will be subsequently described. It will be understood that permeable electrode 46 may also be formed in substantially the manner set forth with respect to grids 14, 16 of horizontal grid device 10.

Figure 3E:
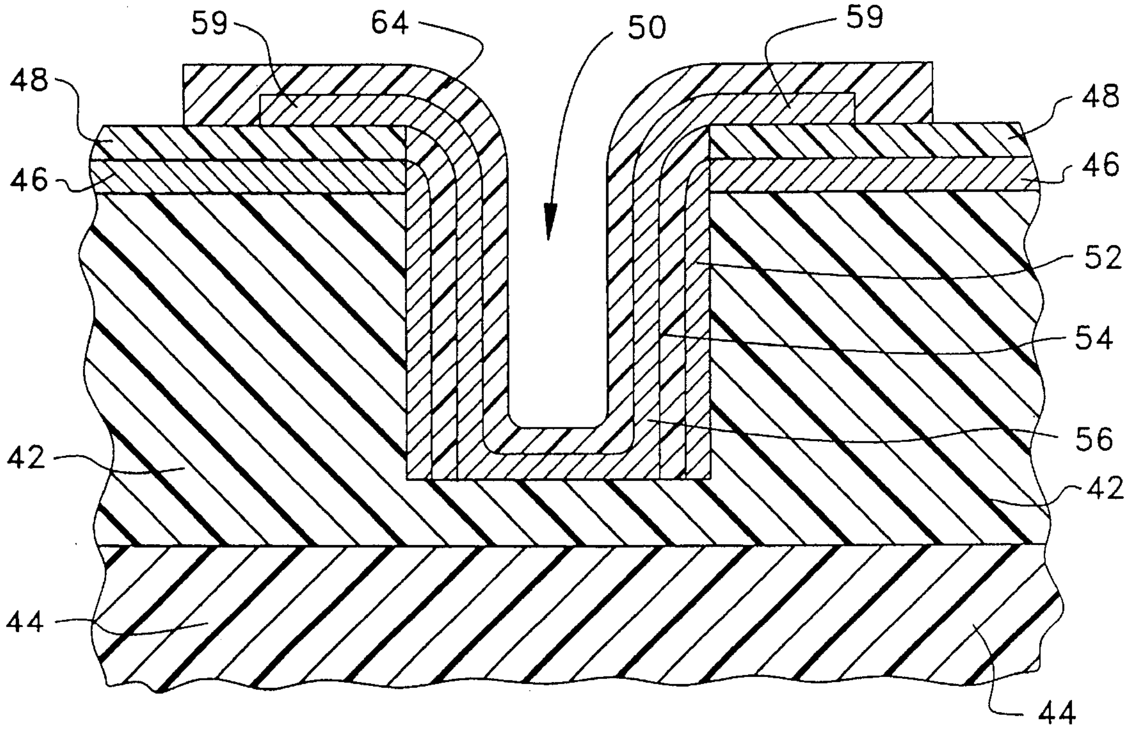

Referring now to FIG. 3E, a layer 64 of insulating material, preferably $SiO_2$, is formed over the structure and into the trench. Insulating layer 64 is then patterned, using photoresist techniques as known in the art, then etched to expose the underlying layer 48 while leaving the ends of the insulating layer 34 extending over the ends of the tabs 58, thereby entirely covering the underlying permeable electrode 56.

Figure 3F:
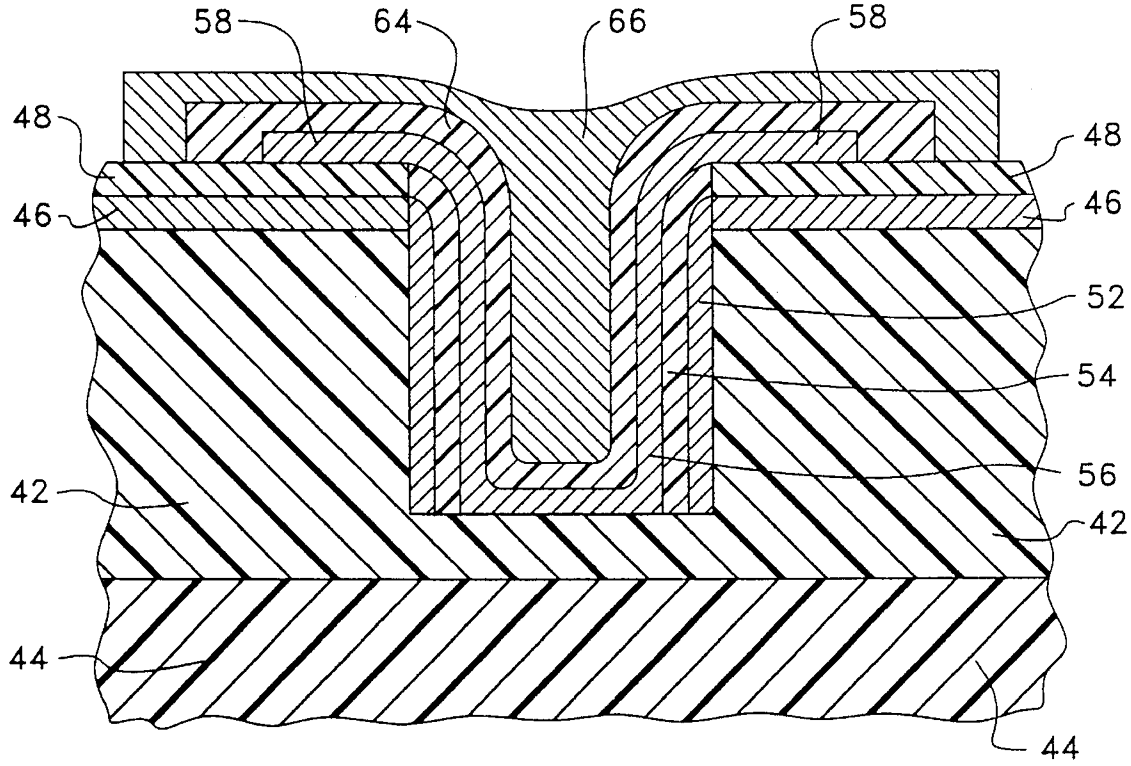
Figure 3G:
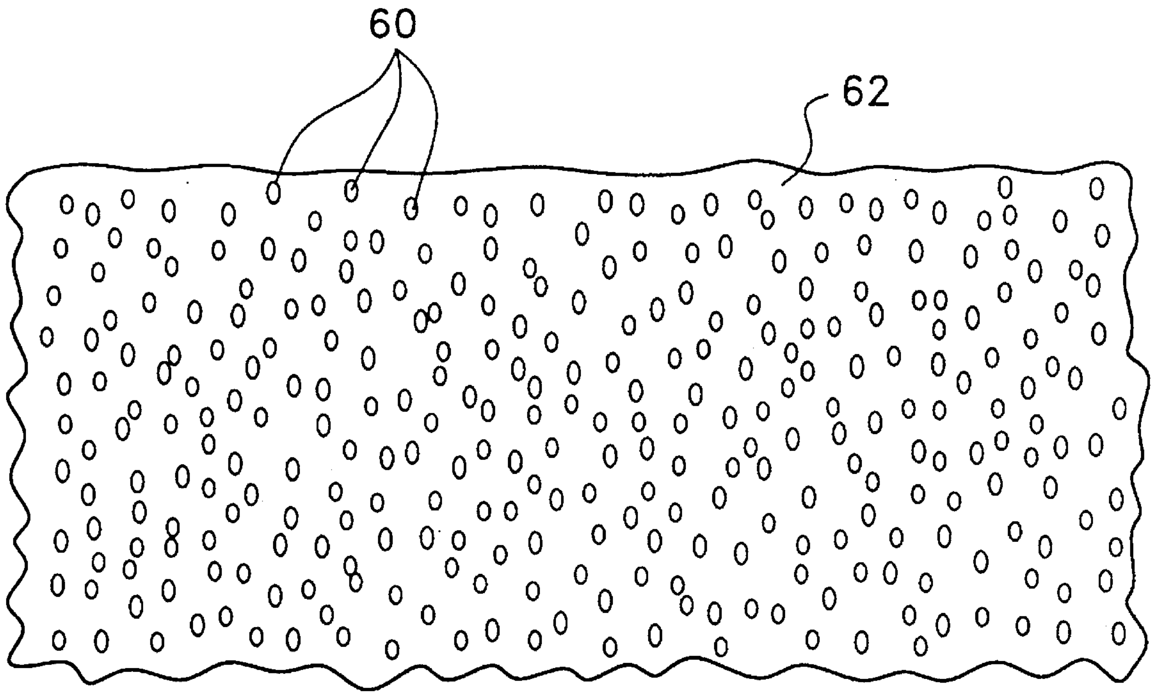

Referring now to FIG. 3F, metal layer 66, preferably comprising tungsten, is formed over the structure and into vertical grid device trench 50. Metal layer 66 is then patterned, using photoresist techniques known in the art, and etched to expose the underlying layer 48 while leaving edges which overlap the underlying insulating layer 64. Field emitters 68 are formed on that portion of the surface of the metal layer 68 disposed within the trench 50.

Completed vertical grid device 40 of the present invention operates as follows. An electrical potential is applied between metal layer 66 and metal layer 52. In the preferred embodiment of vertical grid device 40, metal layer 52 is the anode with respect to metal layer 66 which may serve as the cathode. This potential difference metal layer 52 or anode 52 and metal layer 66 or cathode 66 draws electrons from field emitters 68 on the surface of cathode 66. A bias voltage is applied to grid 56 formed by permeable electrode 56 which then causes vertical grid device 40 to act like a triode as is known in the art.

It should be noted that although in the above detailed description, the metal layer 66 is the cathode and the metal layers 52 comprise the anode, the reverse is possible. That is, layers 52 may form the cathode while metal layer 66 is maintained at a positive potential with respect to the potential of cathode 52. The permeable electrode material will still act as a grid in this embodiment.

Referring now to FIGS. 4A–I, there is shown a method for fabricating integrated circuit arcuate vertical electronic grid device 80 of the present invention. Integrated circuit arcuate vertical electronic grid device 80 is an alternate embodiment of integrated circuit electronic grids devices 10, 40 wherein an arcuate surface may, for example, define a cylinder, an oval cross-section, or any other shape which may be formed by combining an arcuate surface with other arcuate surfaces or with any type of non-arcuate surfaces.

Figure 4A:
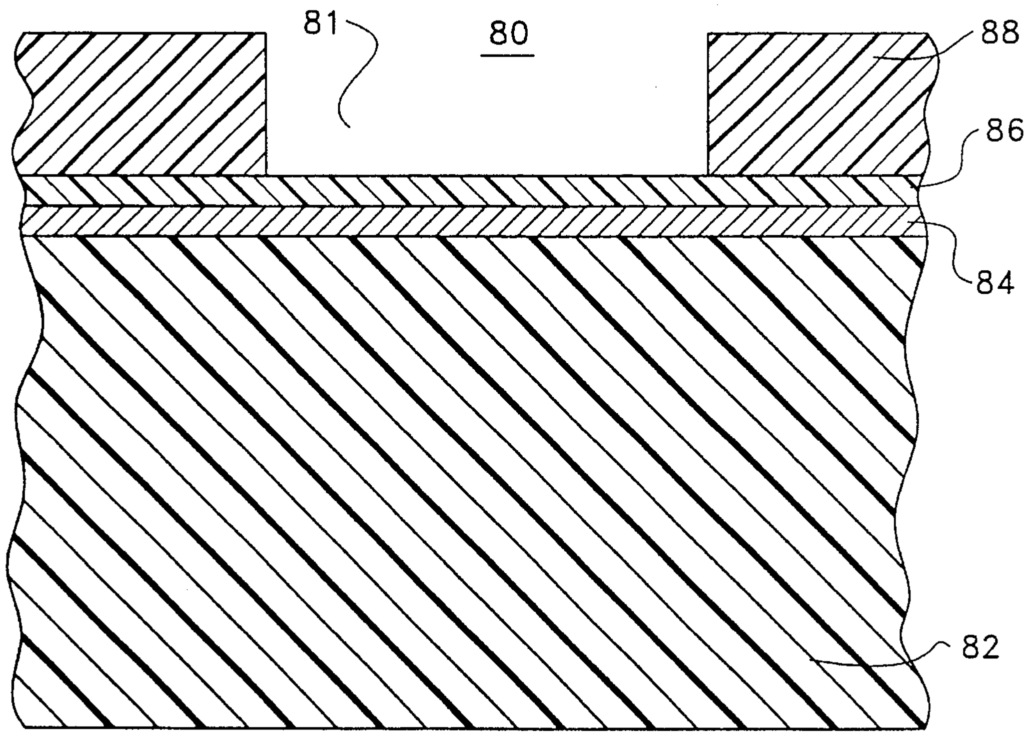
FIGS. 4A–I depict cross sectional views and planar views of various stages of fabrication of an alternate embodiment of the embodiment of the integrated circuit electronic grid device in FIGS. 3A–F in accordance with the present invention wherein the depression is substantially cylindrical.

Referring now to FIG. 4A, substrate 82 of arcuate electronic grid device 80 is covered by metal layer 84 and dielectric layer 86. Substrate 82 may be formed of silicon nitride or any other material suitable for forming electronic grid device 80 as set forth herein. For example, substrate 82 may be formed of a dielectric other than silicon nitride or substrate 82 may be formed of a metal. Forming substrate 82 of metal is particularly suitable when electronic grid device 80 is used for high temperature applications, wherein the metal of metal substrate 82 may act as a heat sink.

Metal layer 84, or conductive layer 84, disposed over the surface of substrate 82 when substrate 82 is not formed of metal, may be formed of, for example, tungsten. Layer 84, which is disposed over substrate 82, may be disposed above an upper surface of substrate 82, or within substrate 82. Likewise electronic grid device 80 may be formed over a printed circuit board or over a multichip carrier or above an upper surface of or within any other suitable material. Masking layer 88 is disposed upon dielectric layer 86, and opening 81 is provided through masking layer 88 to expose a region of dielectric layer 86 for etching.

Figure 4B:
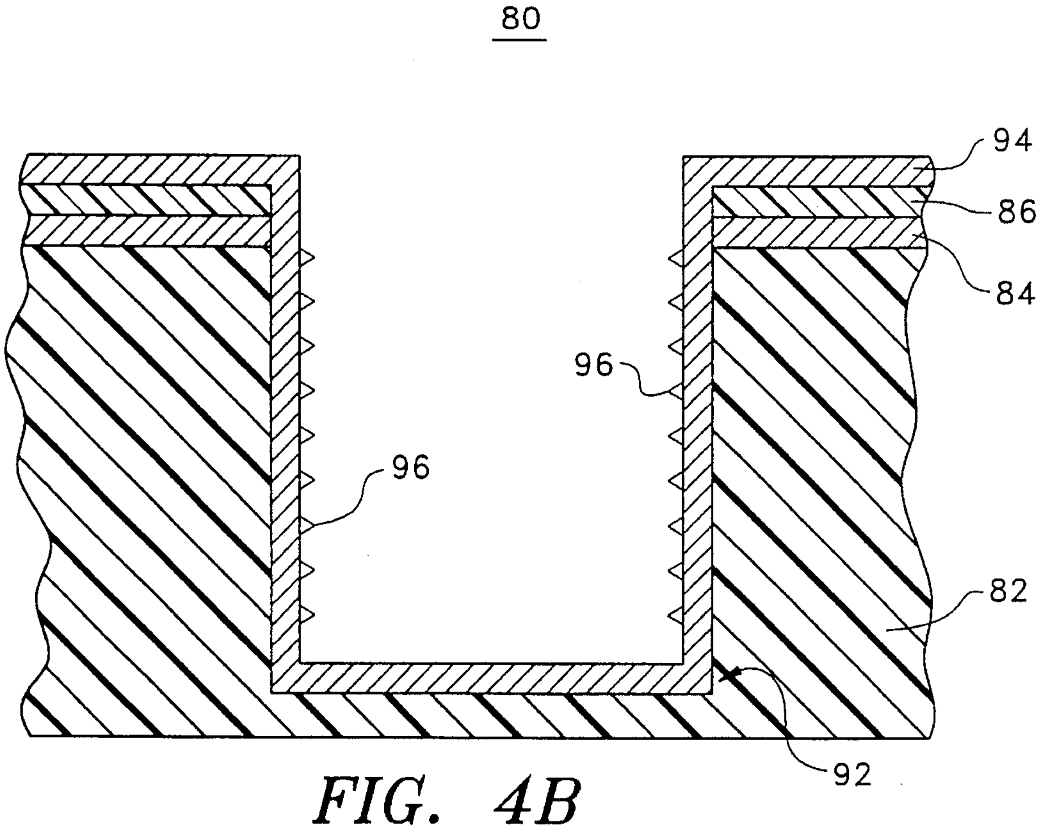
Figure 4C:
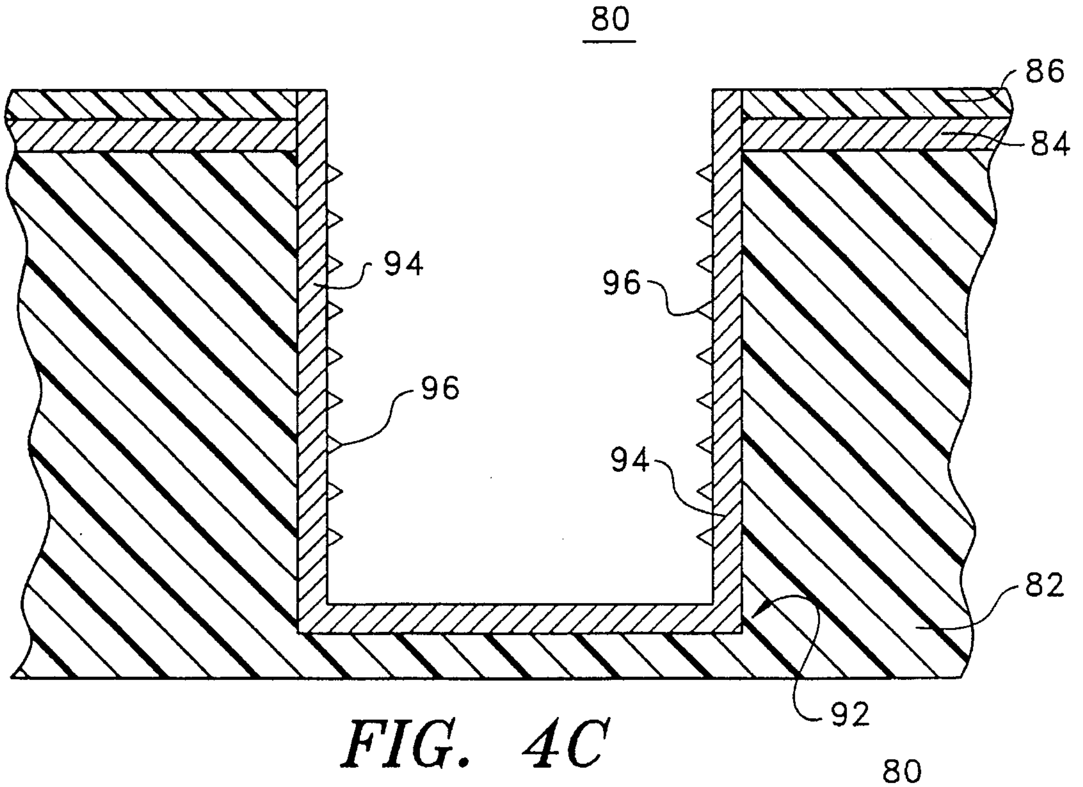

Referring now to FIGS. 4B,C, an etch is performed using masking layer 88 to etch through dielectric layer 86 and metal layer 84 to substrate 82 below opening 81. Trench 92 is then etched into substrate 82 through the openings in dielectric layer 86 and metal layer 84 below opening 81. A barrier layer (not shown) may be deposited over the exposed substantially vertical surfaces of trench 92 within substrate 82 and any CVD metal layer 94, such as CVD tungsten metal layer 94, is disposed over the field of electronic grid device 80. This type of deposition provides highly conformal metal layer 94.

Metal layer 94, within trench 92, is preferably provided with a rough metal surface having a large number of emitters 96. Emitters 96 may be provided by the deposition process itself, by roughening the surface of metal layer 94, or by adding contaminants to metal layer 94. An anisotropic blanket etch of tungsten layer 94 is then performed to remove tungsten layer 94 except on the walls of trench 92. The portion of tungsten layer 94 which remains within trench 92 forms electrode 94 upon the substantially vertical surface of trench 92. Electrode 94 is set forth herein as a circular, cylindrical or tubular electrode 94. However, as previously described, electrode 94 may be an arcuate electrode 94, wherein the arc of arcuate electrode 98 may be an arc of any angle. Additionally, portions of electrode 94 may be flat.

Figure 4D:
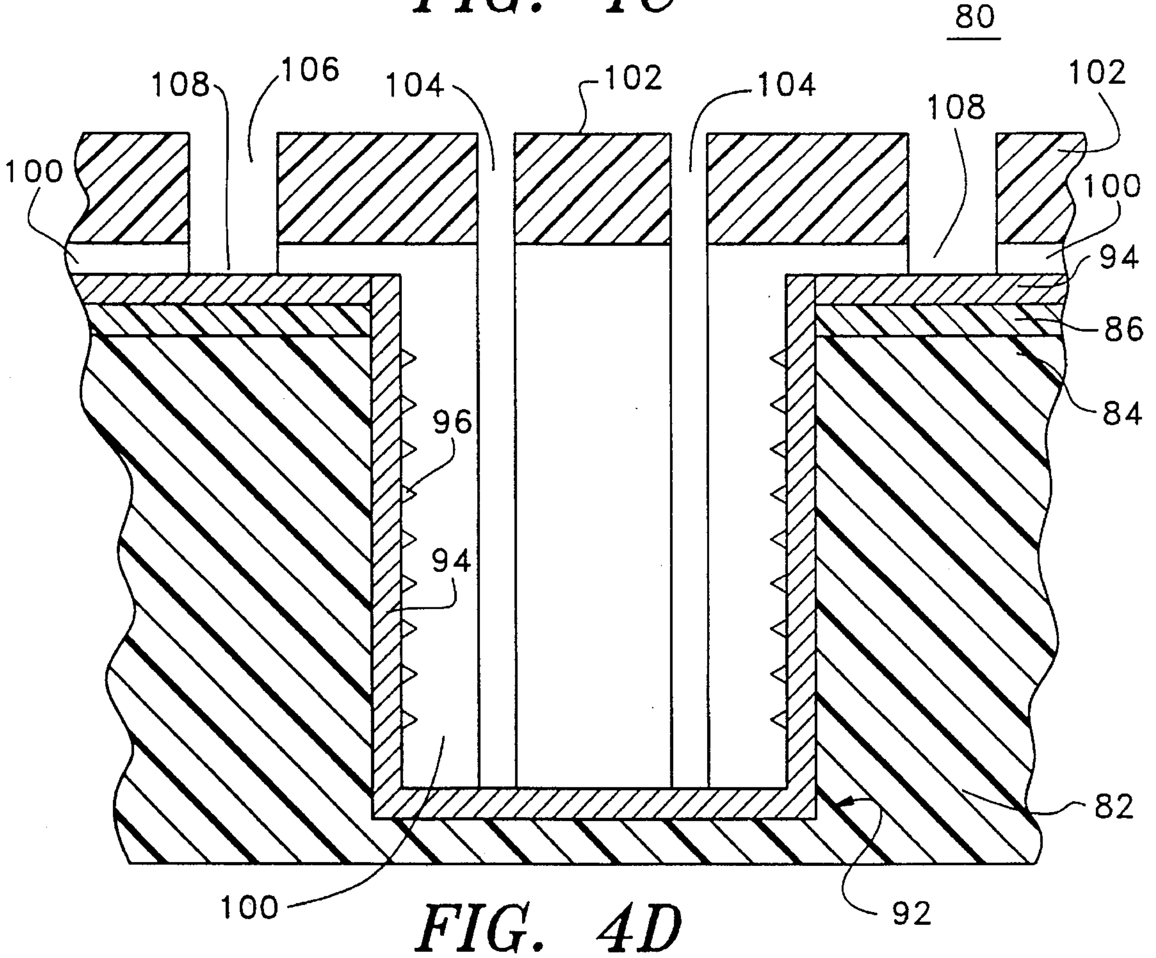

Referring now to FIG. 4D, thick dielectric layer 100 is deposited over the surface of arcuate electronic grid device 80 to fill trench 82 of substrate 82. Planarization of dielectric layer 100 may be performed during deposition or using etch back techniques known to those skilled in the art. Masking layer 102 above thick dielectric layer 100 is provided with mask openings 106 for making contact openings 108. Contact openings 108 extend through thick dielectric layer 100 to nitride layer 86. Masking layer 102 is also provided with further mask openings 104 above trench 92 for making deep holes 109 through thick dielectric layer 100 within trench 92 to and extending to the bottom of trench 92.

Figure 4E:
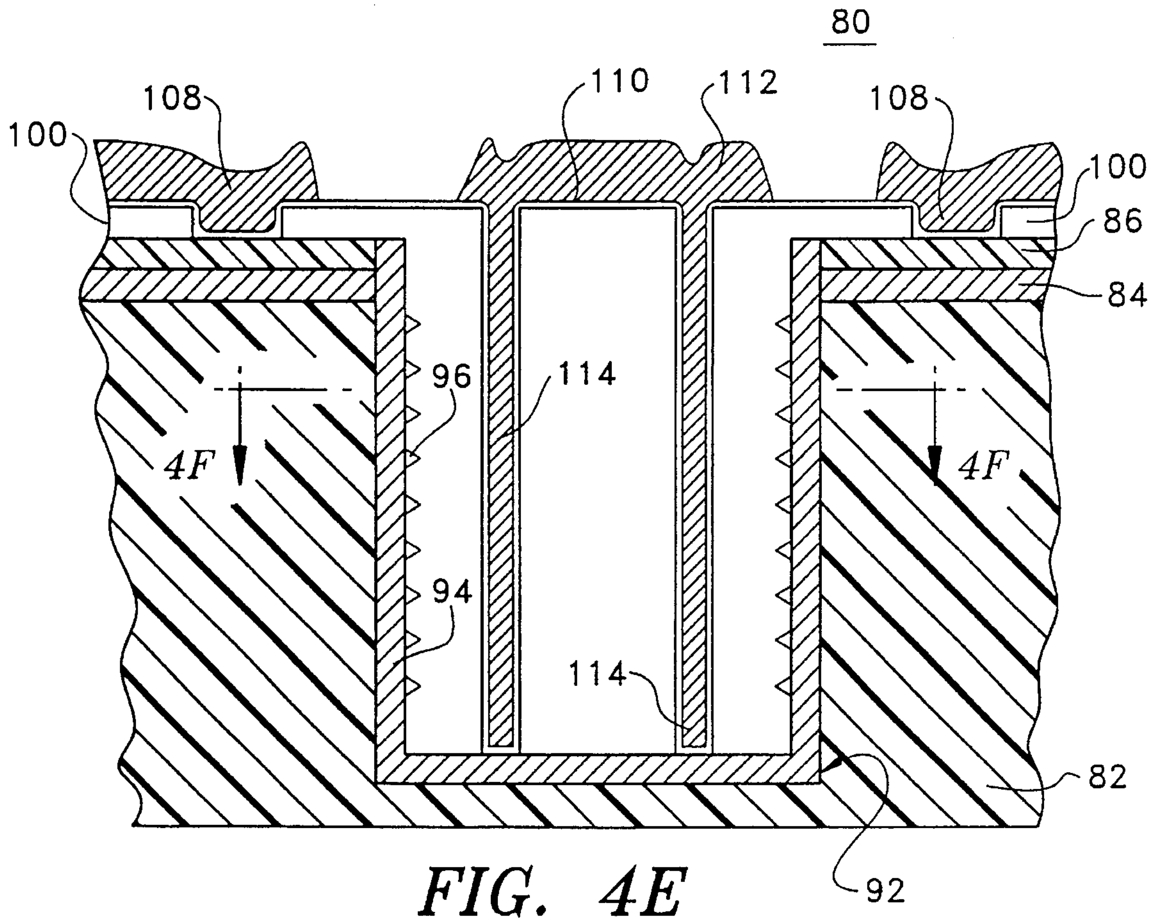
Figure 4F:
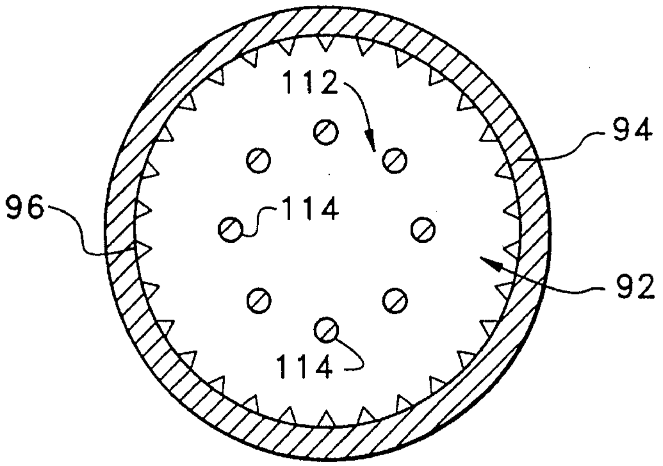

Referring now to FIGS. 4E,F, thin metal barrier layer 110 is disposed over the field of electronic grid device 80. Metal barrier layer 120 is selected to be a poor secondary emitter of electrons, for example, platinum CVD. Deposition of tungsten layer 112 is then performed forming columnar grid rods 114, wherein columnar grid rods 114 are disposed within holes 109 extending through dielectric layer 100 to the bottom of trench 92. Spaced apart columnar grid rods 114, or grid elements 114, are electrically coupled to each other by metal layer 112. The metal surfaces of rods 114 and grid 112 are preferably parallel to the metal surface of electrode 94. They may be disposed in an evenly spaced apart circular arrangement to collectively form single columnar grid 112.

Single columnar grid 112, formed of an array of grid rods 114, may be electrically biased with respect to electrode 94 for causing electrons to be emitted from emitters 96 on the surface of electrode 94. Each grid rod 114 of electronic grid device 80 is thus a grid element 114 of single columnar grid 112. Grid rods 114 may be electrically coupled by a ring shaped interconnect (not shown) in order to form single columnar grid 112. The ring may be broken in order to permit other interconnects to pass therethrough without any grid rod 114 being electrically decoupled from grid 112.

Chemical bonding between the deposited tungsten of grid rods 114 and substrate 82 at the bottom of openings 109 may be used to help anchor grid rods 114. For example, it will be understood by those skilled in the art that if substrate 82 is formed of silicon nitride a chemical reaction between the tungsten of tungsten grid 112 which forms columnar grid rods 114 and the silicon nitride of substrate 82 at the bottom of opening 109 can be enhanced by an adhesion layer of metal (not shown).

Figure 4G:
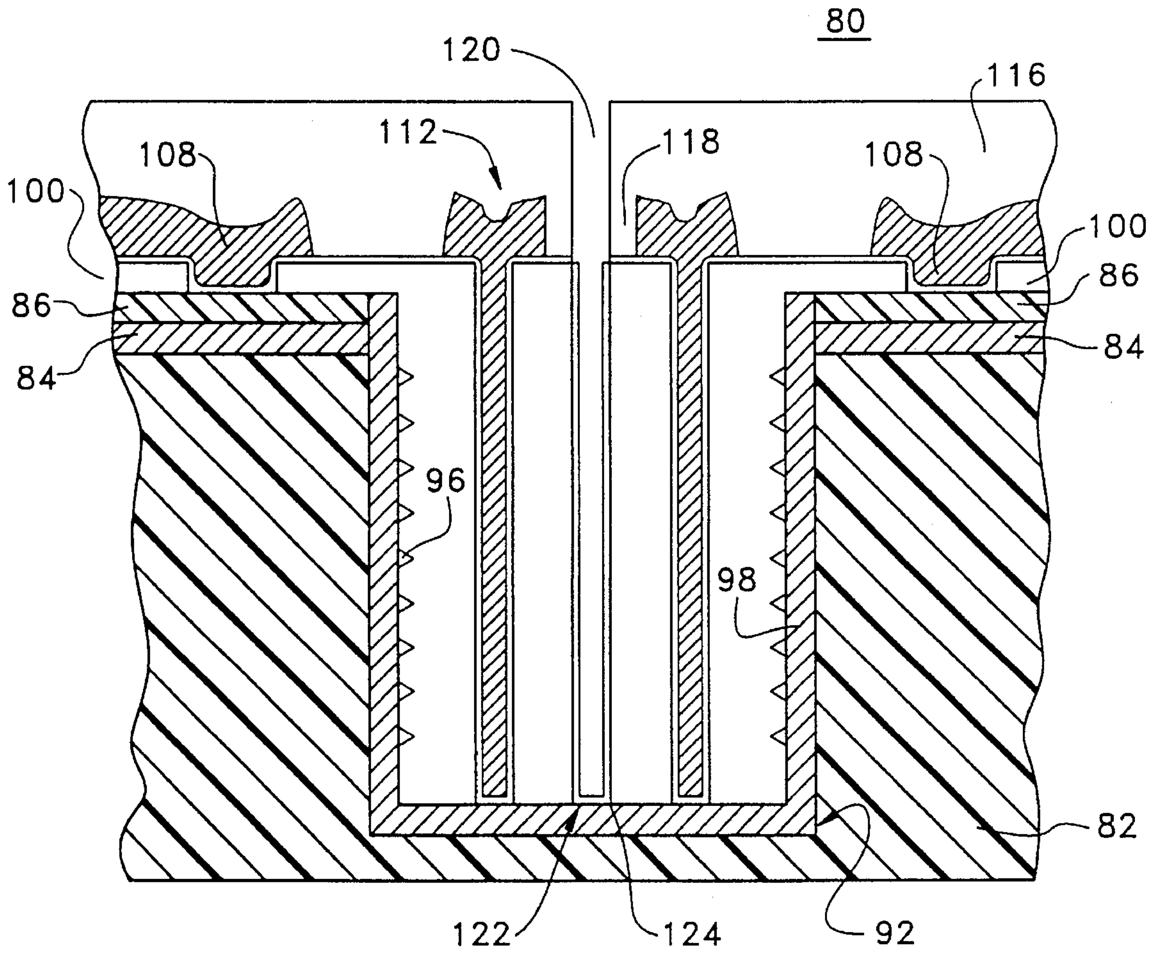

Referring now to FIG. 4G, the surface of tungsten layer 112, formed over the field of arcuate vertical electronic grid device 80, is covered by dielectric layer 116. An opening is provided through dielectric layer 116 at the center of trench 92 or depression 92. An etch is then performed through tungsten layer 112 to the top of dielectric layer 100 to provide relatively wide opening 118 in tungsten layer 112. A second relatively narrow opening 120 through dielectric layer 116 is then provided. Relatively narrow opening 120 in dielectric layer 116 has a smaller radius than relatively wide opening 118 through tungsten layer 112. Thus, tungsten layer 62 is etched back a distance from hole 122 which is formed to the bottom of trench 92. Barrier layer 124 is then deposited on the inner surface of hole 122 or opening 122.

Figure 4H:
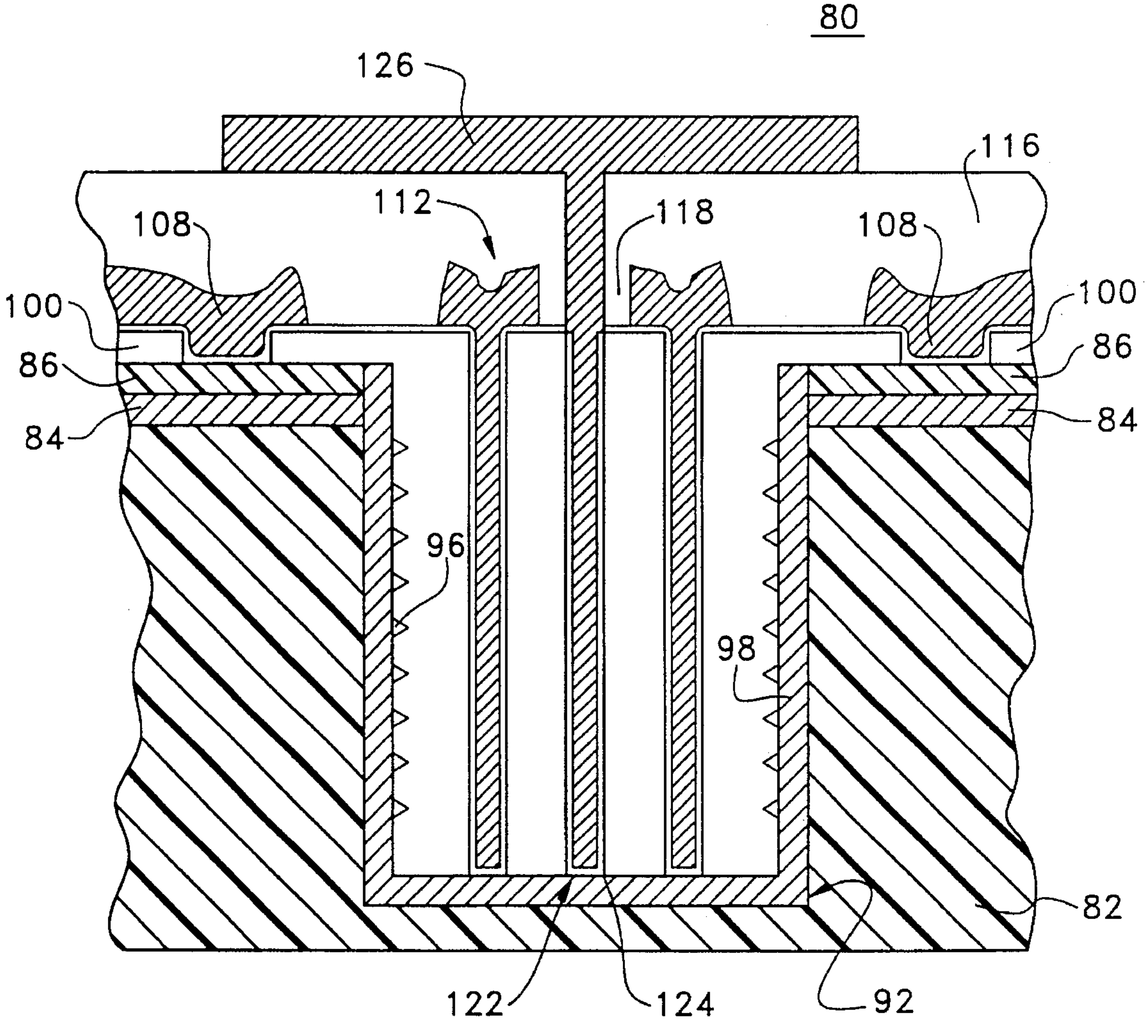

Referring now to FIG. 4H, there is shown a cross sectional representation of arcuate vertical electronic grid device 80. Arcuate electronic grid device 80 is provided with electrode 126 or central collector 126, formed in opening 122 by depositing, for example, CVD tungsten, into opening 122. Collector 126 collects electrons which are emitted from emitters 96 on the surface of electrode 98, pass between grid elements 114 or single columnar emission grid 114, and continue past grid elements 114.

In the preferred embodiment of grid device 80, an opening (not shown) may then be made into electronic grid device 80 to dielectric layer 100 within trench 92 in order to wet or dry etch dielectric layer 100 from within trench 92. The opening need not be a line of sight opening, and may be sealed while electronic grid device 80 is within a vacuum or a partial vacuum to provide a vacuum or a partial vacuum within trench 81 of electronic grid device 80. Additionally, inert gas may be disposed within electronic grid device 80 before sealing the wet etch opening.

Figure 4I:
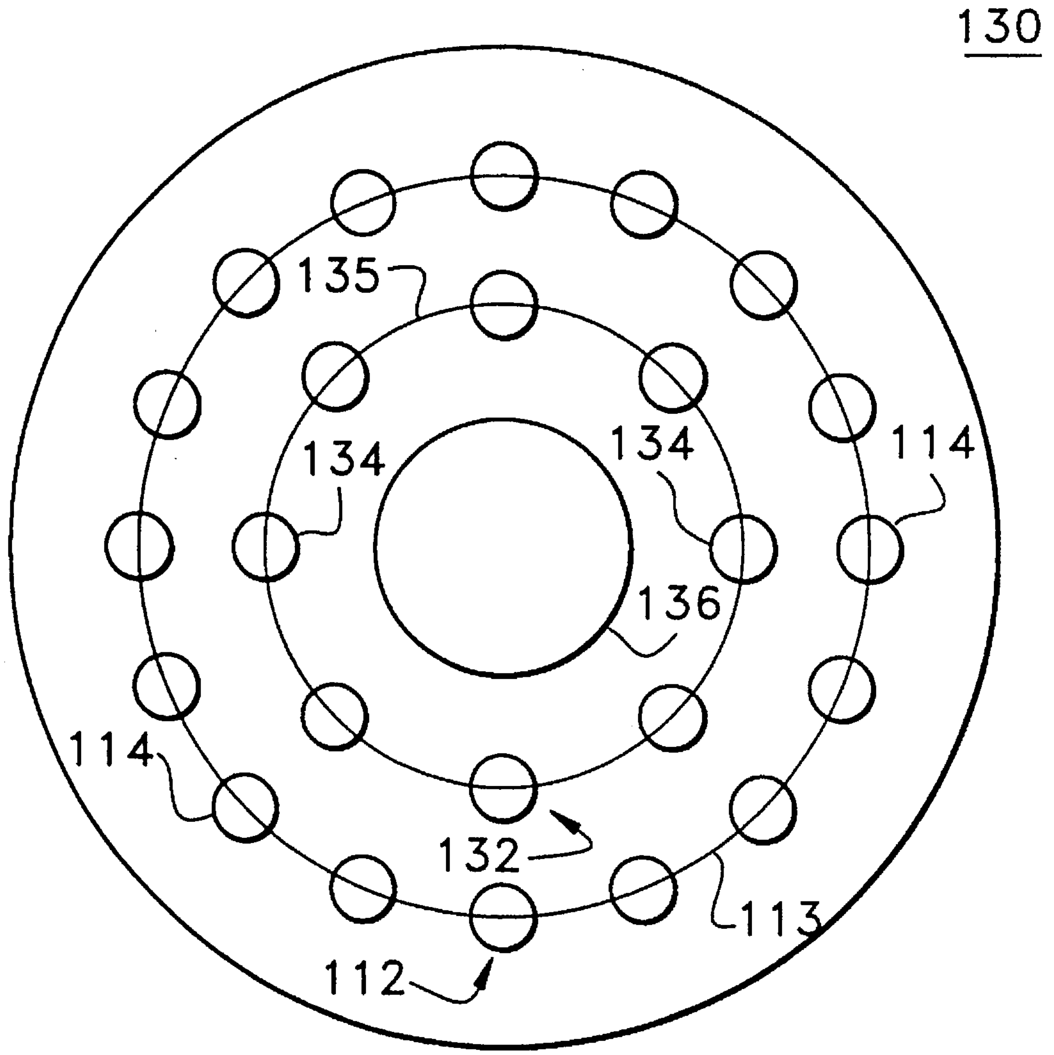

Referring now to FIG. 4I, there is shown a cross-sectional representation of cylindrical electronic grid device 130. Electronic grid device 130 is an alternate embodiment of arcuate electronic grid device 80. In addition to columnar emission grid 112, formed of an array of grid rods 114 connected by ring shaped interconnect 113 (shown schematically), electronic grid device 130 is provided with a further columnar grid 132 or control grid 132. Further columnar grid 132 or control grid 132 is formed of an array of spaced apart grid rods 134, wherein grid rods 134 are electrically coupled to each other by ring interconnect 135 (shown schematically) and disposed between grid rods 114 and collector 136. Grid 112 is electrically decoupled from grid 132. Further columnar grid 132 may thus be formed in the same manner as columnar grid 112 and may be used to modulate the flow of electrons passing between grid rods 132 toward collector 136 as previously described with respect to electronic grid device 10. It will be understood by those skilled in the art that any number of further grids may be provided.

Figure 5:
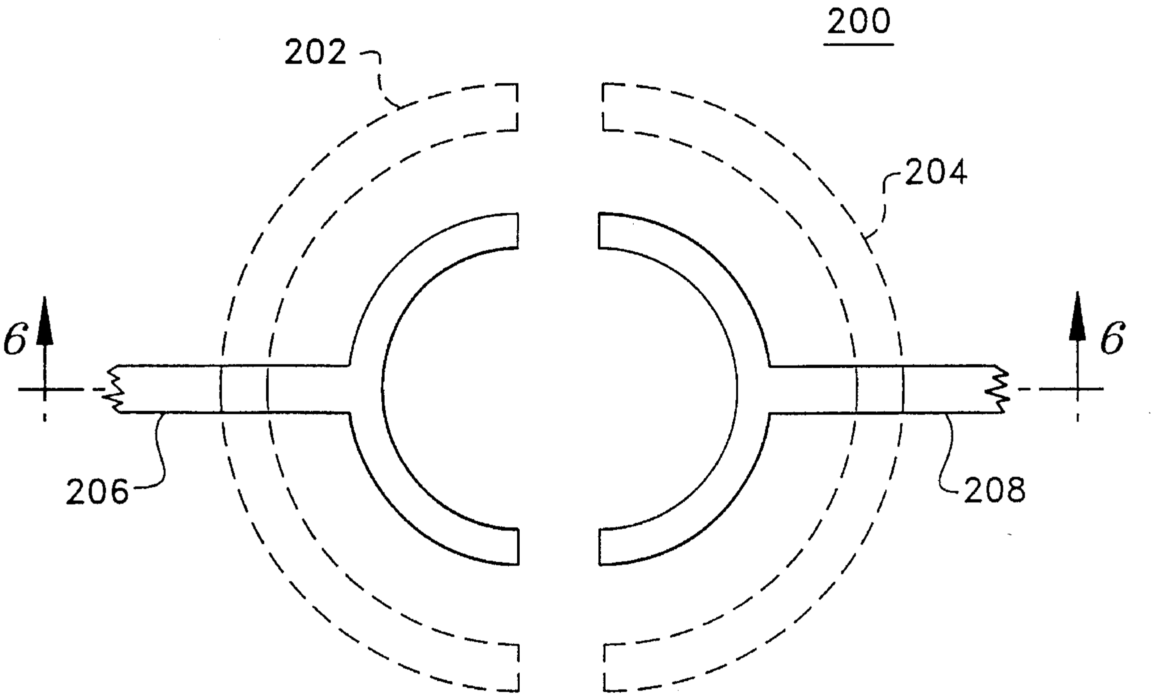
FIG. 5 depicts a cross sectional top view of an integrated circuit electronic grid device in accordance with the present invention wherein the depression is substantially cylindrical.
Figure 6:
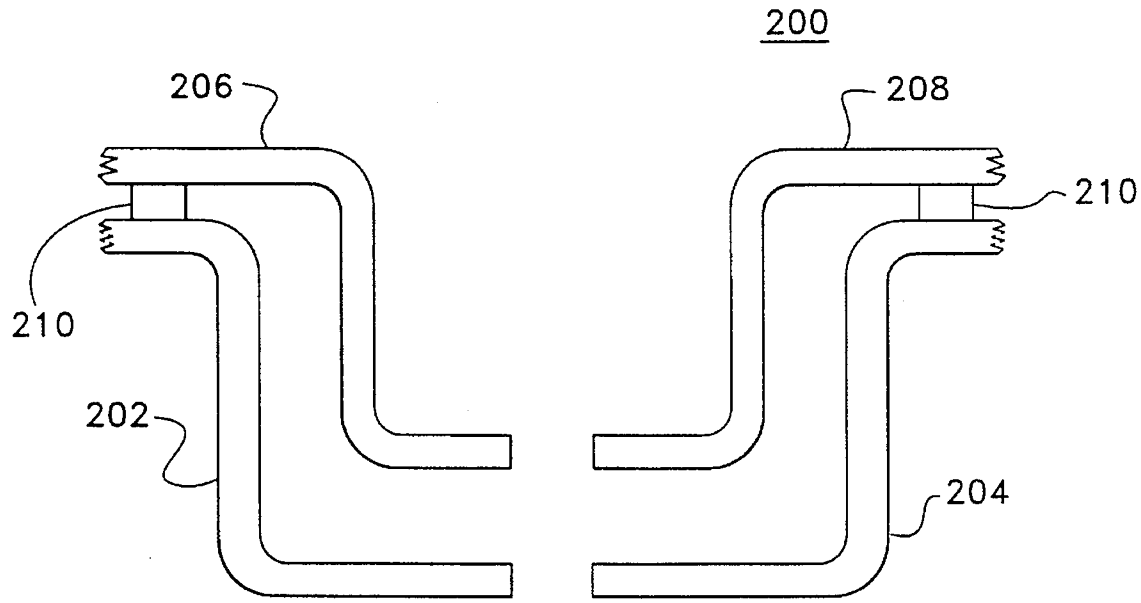
FIG. 6 is a diagrammatic cross-section taken along lines 6—6 of FIG. 5.

Referring now to FIGS. 5,6, there is diagrammatically depicted a top view of a vertical electronic grid device 200 in accordance with the present invention. It will be understood that FIG. 6 is a cross sectional representation of electronic grid device 200 wherein any structures not in the plane of the cross section are omitted. It will also be understood by those skilled in the art that electrode 94 of grid device 80 may be etched to form two vertical slits dividing electrode 94 into two separate semicircular electrodes 202, 204. Additionally, ring interconnects, such as ring interconnects 113, 135 of grid device 130, may be etched to form two separate semicircular connectors 206, 208. Semicircular connectors 206, 208 may be spaced apart from electrodes 202, 204 by pads 210. Using this method, a four electrode device may be formed with fewer fabrication steps wherein the electrodes are approximately one-half as large. Within electronic grid device 200 electrode 202 may serve as an emitter while electrode 204 may serve as a collection. Alternately electrode 204 may serve as an emitter and electrode 202 may serve as a collector.

Referring now to FIGS. 7A–J, there is shown a method for fabricating integrated circuit rectangular vertical electronic grid device 300 of the present invention. Vertical electronic grid device 300 is a further alternate embodiment of the vertical electronic grid devices of the present invention.

Figure 7A:
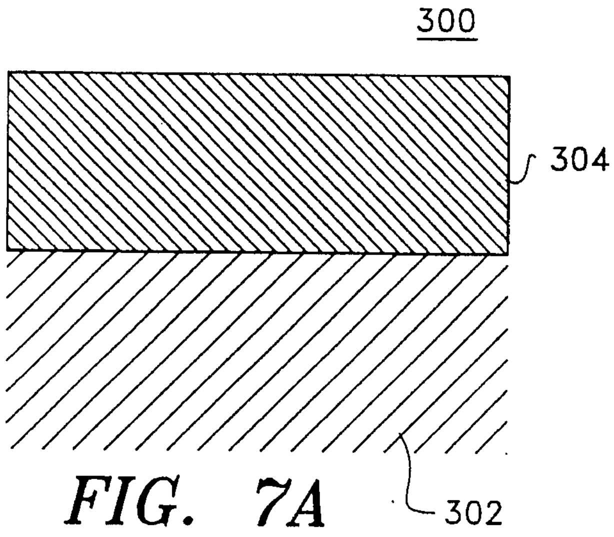
FIGS. 7A–J depict a vertical electronic grid device according to the present invention.
Figure 7B:
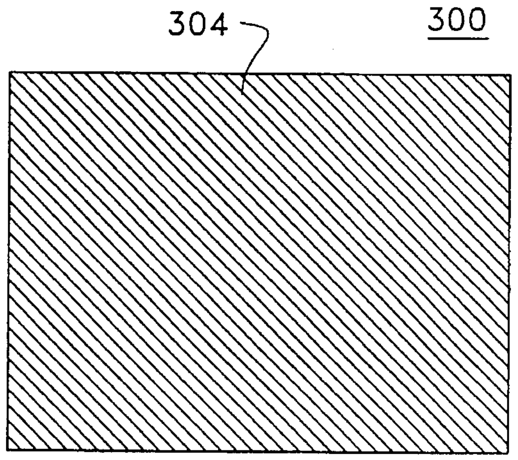

Referring now to FIGS. 7A,B, there are shown, respectively, side and top views of substrate 304 for forming vertical electronic grid device 300. Substrate 304 may be formed of, for example, silicon nitride. Silicon nitride substrate 304 may be formed upon further substrate 302. Further substrate 302 may be formed of silicon dioxide. It will be understood by those skilled in the art, that electronic grid device 300 may be disposed over substrate 304. When electronic grid device 300 is disposed over substrate 304, electronic grid device 300 may be disposed within substrate 304 or above an upper surface of substrate 304. Furthermore, electronic grid device 34 may be disposed over a printed circuit board, a multichip carrier, or above or within any other suitable substrate. It will also be understood that substrate 304 of electronic grid device 300 may be formed of a metal or of a nonmetallic material such as a semiconductor material. Forming substrate 302 of metal is particularly suitable when electronic grid device 300 is used for high temperature applications wherein the metal of metal substrate 302 may act as a heat sink.

Figure 7C:
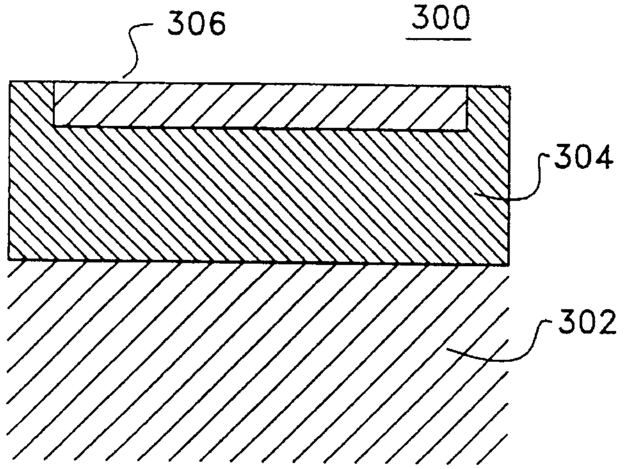
Figure 7D:
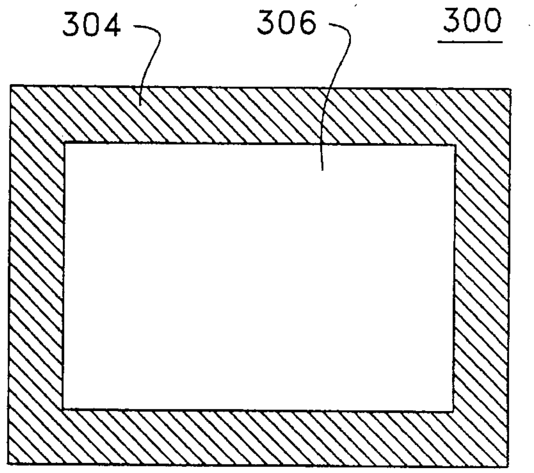

Referring now to FIGS. 7C,D, there are shown further side and top views of substrate 304 for forming vertical electronic grid device 300. Substrate 304 is etched to form a well for deposition of dielectric layer 306 within substrate 304. Dielectric layer 306 may be silicon dioxide. After deposition of substrate 306 over substrate 304, the surface of substrate 306 is planarized to the level of substrate 304.

Figure 7E:
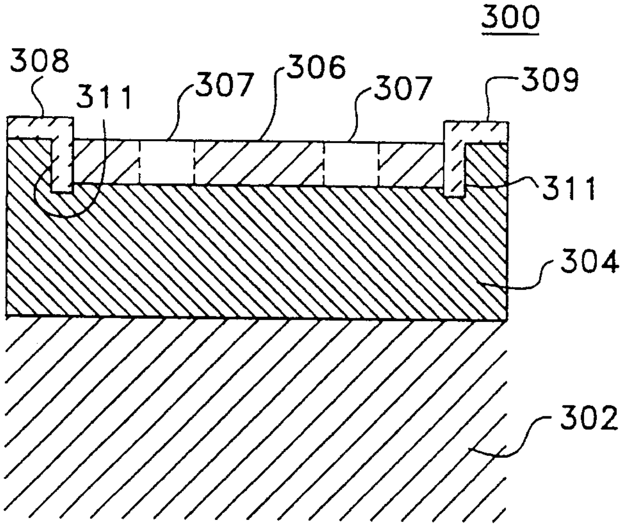
Figure 7F:
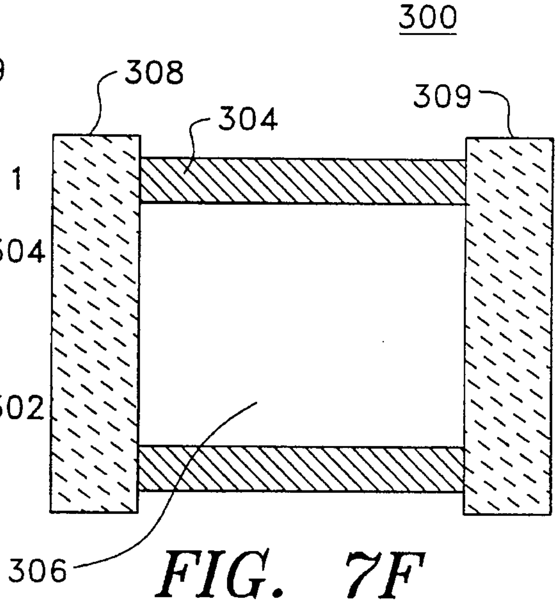

Referring now to FIGS. 7E,F, emitter electrode 308 and collector electrode 309 are shown. To form emitter electrode 308 and collector electrode 309, channels 311 are etched at two opposing boundaries between substrate 304 and dielectric layer 306. A blanket deposition of a metal, for example tungsten, is performed. As a result of this tungsten deposition, channels 311 at the two opposing boundaries between substrate 304 and dielectric layer 306 are filled with tungsten and a layer of tungsten is formed on the entire field of electronic grid device 300. The tungsten layer is then removed from above the surface of dielectric layer 306. It will be understood that the surface of emitter electrode 308 facing collector electrode 309 may be roughened to provide many small regions for emitting electrons as previously described. A plurality of spaced apart openings 307 are etched through dielectric layer 306 to substrate 304.

Figure 7G:
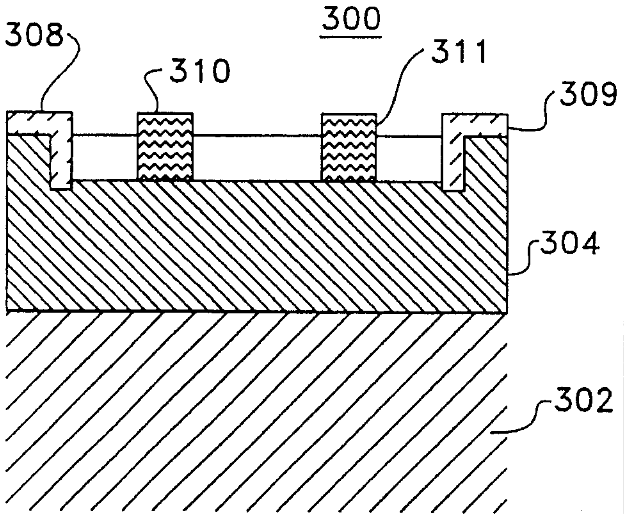
Figure 7H:
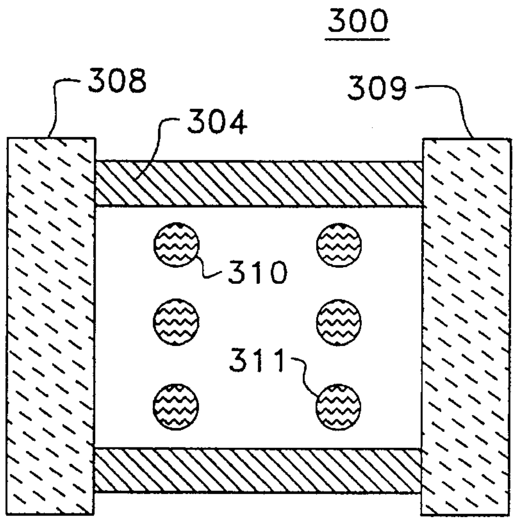

Referring now to FIGS. 7G,H, openings 307 are filled with tungsten and dielectric layer 306 is removed by a conventional etching process. Thus a plurality of spaced apart grid rods 310 and spaced apart grid rods 311 are provided. Within vertical electronic grid device 300, a first array of grid rods is positioned as a row of grid rods 310, separated a small distance from emitter electrode 308 and equidistant from emitter electrode 308. When grid rods 310 are electrically biased with respect to emitter electrode 308, grid rods 310 cause electrons to be emitted from the surface of emitter electrode 308 or cathode 308. The electrons thus emitted from the surface of emitter electrode 308 or cathode 308 pass between individual spaced apart grid rods 310 and are collected by collector electrode 309 or anode 309. It will be understood that grid elements 310 are not necessarily formed as cylindrical rods as illustrated but may be formed as any structure suitable for being spaced apart from each other to draw electrons from electrode 308 and allow the electrons to pass therebetween.

Also within grid device 100, a second array of grid rods 311 is disposed between grid rods 310 and collector electrode 309 as a row of grid rods 311, equidistant from collector electrode 309. Grid rods 311 are also spaced apart to permit electrons which have flowed from the surface of emitter grid 308 and past grid rods 310 to pass between individual spaced apart grid rods 311 for collection by collector electrode 309 or anode 309. Grid rods 311 may therefore be used to modulate the flow of electrons past grid rods 310 as previously described with respect to electronic grid device 10. As previously described with respect to grid elements 310, grid elements 311 need not be cylindrical.

Figure 7I:
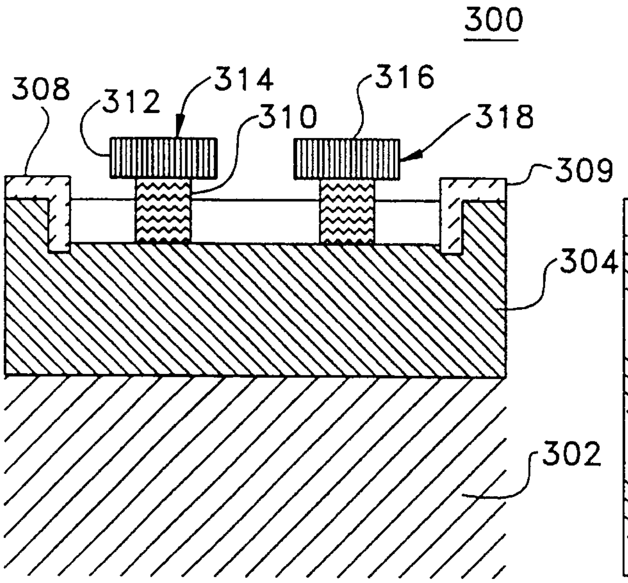
Figure 7J:
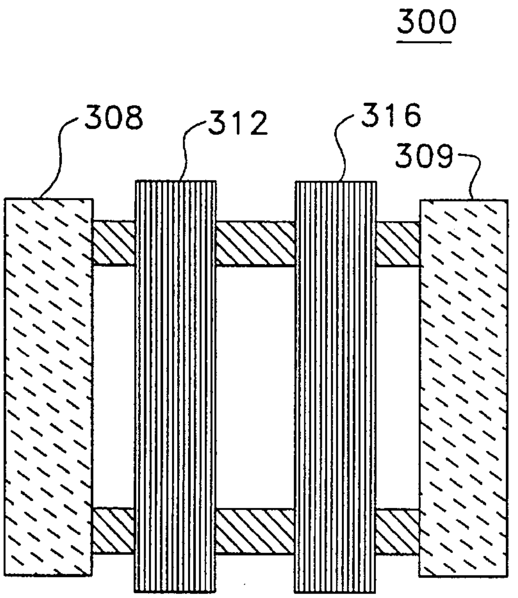

Referring now to FIGS. 7I,J, electrically conducting strip 312 is provided to electrically couple grid elements 310 to each other and to permit grid elements 310 to collectively serve as a single control grid 314. Additionally, electrically conducting strip 316 electrically couples grid elements 311 to permit grid elements 311 to operate as a single screen grid 318 or as a single control grid 318.

Figure 8A:
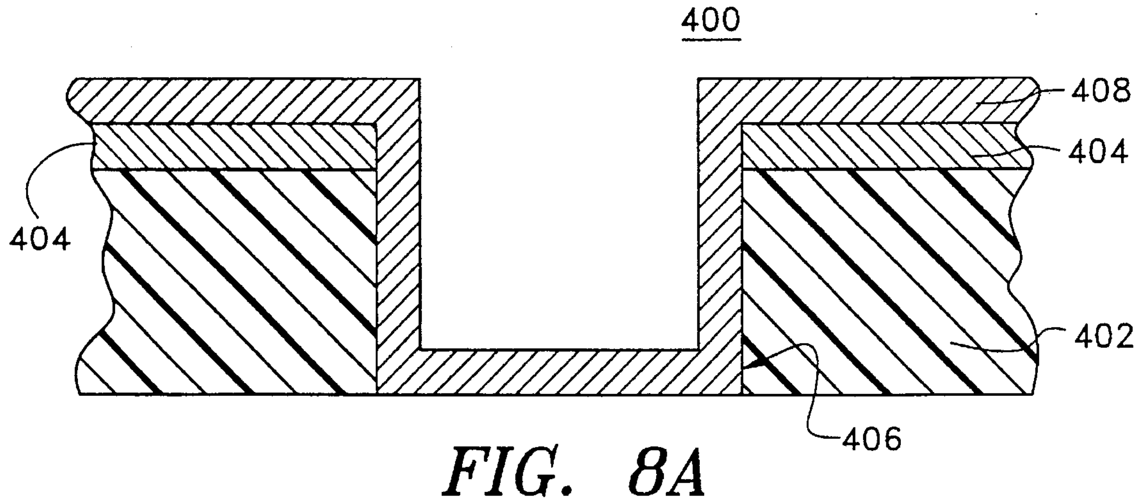
FIGS. 8A–D depict a vertical electronic grid device according to the present invention.
Figure 8B:
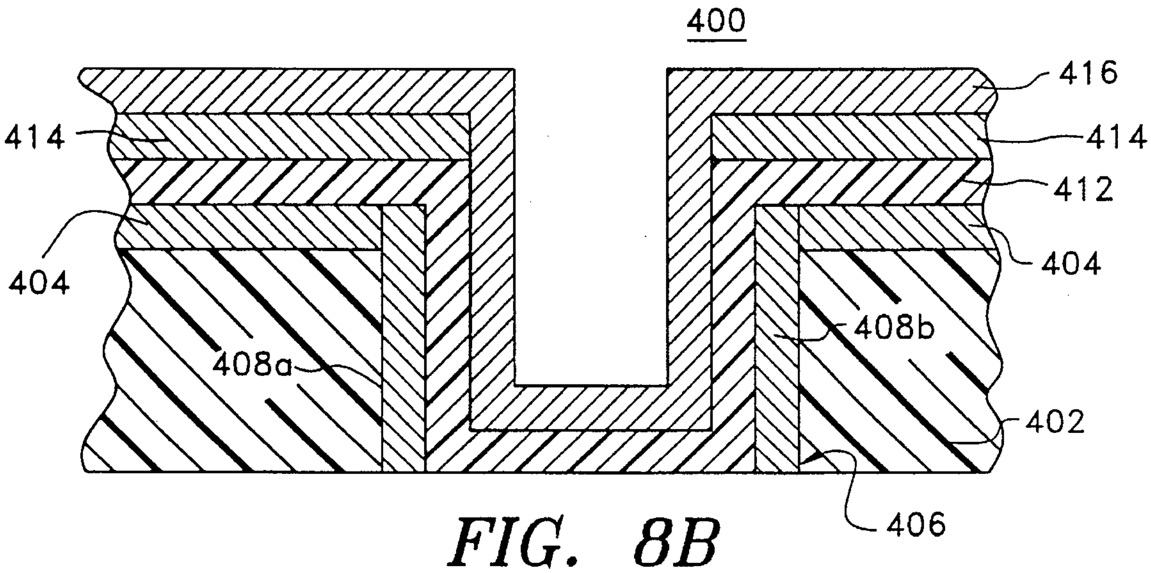
Figure 8C:
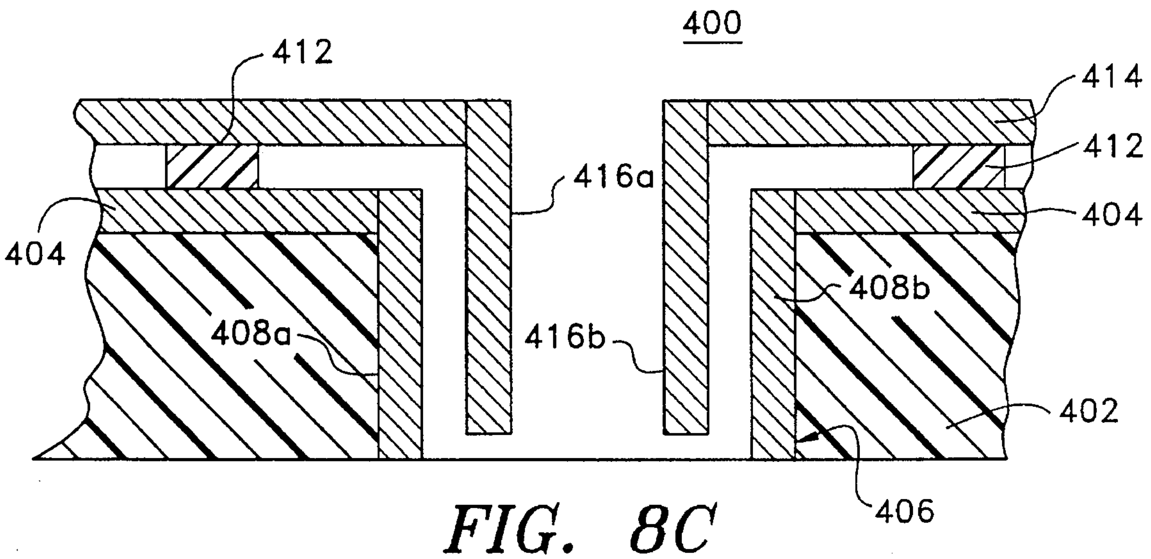

Referring now to FIGS. 8A–C, there is shown a method for fabricating integrated circuit vertical electronic grid device 400 of the present invention. Electronic grid device 400 is a further alternate embodiment of electronic grid device 10. To form electronic grid device 400, a conductive layer 404 is deposited on the surface of substrate 402. It will be understood that electronic grid device 400 may also be disposed over substrate 402 and that substrate 402 may be any type of substrate as previously described. When electronic grid device 400 is disposed over substrate 402, electronic grid device 400 may be disposed above an upper surface of substrate 402 or within substrate 402. It will be further understood that substrate 402 may be metal, nonmetallic, a printed circuit board, a multichip carrier, or any other suitable material. Conductive layer 404 may, for example, be aluminum.

To fabricate integrated circuit vertical electronic grid device 400, an etching operation is performed to provide an opening through conductive layer 404 and to form trench 406 or depression in substrate 402. A conformal deposition of tungsten is performed to form metal layer 408 over the surface of trench 106 and over the surface of conductive layer 404. An anisotropic etch of tungsten layer 408 is performed to remove tungsten layer 408 above metal layer 404 and on the bottom of trench 406.

Referring now to FIG. 8B, tungsten electrodes *408a,b* remain on the walls of trench 406 after the anisotropic etch. The etch removes the portions of tungsten layer 408 above conductive layer 404 and the portion of tungsten layer 108 at the bottom of trench 406. Electrodes *408a,b* are electrically coupled to portions of conductive layer 404. Thus portions of conductive layer 404 may serve as leads for electrodes *408a,b*. It will be understood by those skilled in the art that the surface of one electrode *408a,b*, for example electrode *408a*, may be roughened to provide good electron emitters as previously described.

A conformal deposition of dielectric is performed to provide dielectric layer 412 over the surface of conductive layer 404, electrodes *408a,b* and the bottom of trench 406 within substrate 402. Dielectric layer 412 is covered with conductive layer 414. Conductive layer 414 may be, for example, aluminum. An opening is then provided in conductive layer 414 above trench 406 to expose the surface of dielectric layer 412 or dielectric material 412 within trench 406. Tungsten layer 416 is then deposited over the surface of conductive layer 414 and the exposed surface of dielectric layer 412.

Referring now to FIG. 8C, an anisotropic etch is performed to remove tungsten layer 416 above conductive layer 414 and in the bottom of trench 406. This causes two electrodes 416a,b to remain. Electrodes 416a,b are spaced apart from respective electrodes 408a,b. Additionally, electrodes 416a,b are electrically coupled to respective portions of conductive layer 414, and electrically decoupled from each other. Portions of conductive layer 414 therefore serve as leads for electrodes 416a,b. Electrodes 416a,b are adapted to permit electrons to pass therethrough. For example, when electrode 416a is biased positive with respect to electrode 408a, electrons are emitted from the surface of electrode 408a and flow toward electrode 416a. In order to permit the electrons emitted from the surface of electrode 408a to continue past electrode 416a, the openings are provided through electrode 416a.

A hole (not shown) may be opened in conductive layer 414 to permit a wet etch to remove dielectric material 412 within trench 406 between conductive layers 404, 414 and between electrodes 408a,b, 416a,b. Portions of dielectric layer 412 may be left between conductive layers 404, 414 within electronic grid device 400 for physical support. The space vacated by etched away dielectric layer 412 may be filled with air or an inert gas. Additionally, it may be evacuated to form a vacuum or a partial vacuum. A central electrode 420 may then be provided in the center of electronic grid device 400. It will be understood by those skilled in the art that electrodes 416a,b float with respect to the bottom of trench 406 as distinguished from, for example, electrodes 114 which make physical contact with, and chemically bond with, the bottom of trench 92.

Figure 8D:
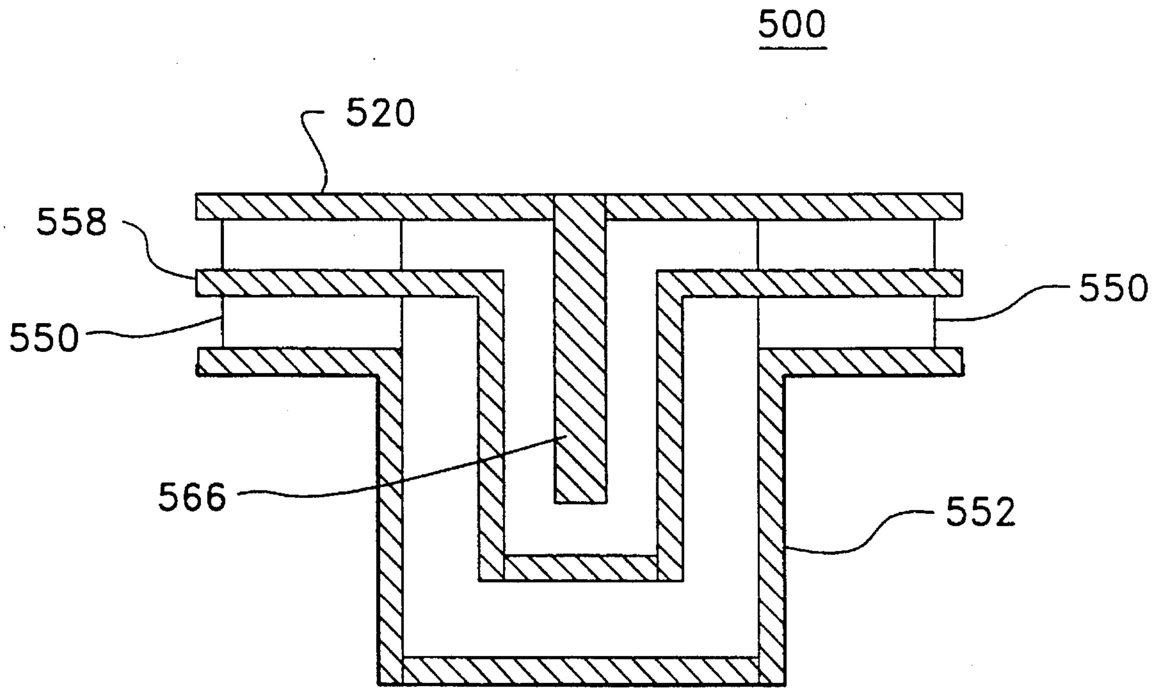

Referring now to FIG. 8D, there is shown vertical electronic grid device 500. Vertical electronic grid device 500 may be formed by disposing metal layer 552 and covering metal layer 552 with a silicon nitride layer. The silicone nitride layer may later be removed except for pads 550 using a wet etch process as previously described. Metal layer 558 may be conformally disposed above metal layer 552 and provided with a plurality of holes therethrough to form a grid as previously described. Thus, if electronic grid device 500 is formed as a cylinder, metal layer 558 is formed as a permeable cylindrical basket. Permeable grid 558 may then serve as a grid between emitter 520 and collector 552 of electronic grid device 500. Additionally, it will be understood by those skilled in the art that electrode 552 may serve as the emitter and electrode 520 may serve as the collector. In either case cylindrical permeable metal layer 448 may serve as a grid.

It will be understood that various changes in the details, materials and arrangements of the parts which have been described and illustrated in order to explain the nature of this invention, may be made by those skilled in the art without departing from the principle and scope of the invention as expressed in the following claims.

We claim:

1. An integrated circuit electronic grid device, comprising:

a depression having a substantially vertical depression surface;

a first metal surface disposed substantially parallel to said vertical depression surface, said first metal surface having a plurality of emitters disposed thereupon;

a second metal surface insulated from said first metal surface by a first dielectric medium;

electrical biasing means coupled to said first and second metal surfaces for providing an electrical bias between said first and second metal surface to provide a flow of electrons from the surface of said first metal layer toward said second metal surface; and, said second metal surface being formed with a plurality of holes therethrough adapted for permitting said flow of electrons to pass through said second metal surface wherein at least a portion of said holes are nonaligned with respect to said emitters.

2. The integrated circuit electronic grid device of claim 1, wherein said depression is a trench.

3. The integrated circuit device of claim 2, wherein said trench is rectangular.

4. The integrated circuit electronic grid device of claim 1, wherein at least a portion of said depression surface is arcuate.

5. The integrated circuit device of claim 4, wherein said arcuate surface is cylindrical.

6. The integrated circuit device of claim 1, wherein said depression is formed over the surface of a substrate.

7. The integrated circuit device of claim 1, wherein said depression is formed upon a metal substrate.

8. The integrated circuit device of claim 1, wherein said second metal surface comprises a plurality of grid elements.

9. The integrated circuit device of claim 8, wherein said grid elements are disposed in a circular arrangement.

10. The integrated circuit device of claim 8, wherein said grid elements are disposed in a linear array.

11. The integrated circuit electronic grid device of claim 1, further comprising a third metal surface spaced apart from said second metal surface and insulated from said second metal surface by a second dielectric medium.

12. The integrated circuit device of claim 11, wherein said third metal layer comprises a plurality of grid elements.

13. The integrated circuit device of claim 11, wherein said third metal surface is a permeable metal layer.

14. The integrated circuit electronic grid device of claim 11, further comprising a fourth metal surface spaced apart from said third metal surface and insulated from said third metal surface by a third dielectric medium.

15. The integrated circuit device of claim 12, wherein said fourth metal layer comprises an electrode substantially surrounded by said first metal surface.

16. The integrated circuit electronic grid device of claim 14, further comprising means for applying a modulation signal to said third metal surface to modulate said flow of electrons in accordance with said modulation signal.

17. The integrated circuit electronic grid device of claim 11, wherein said third metal surface is formed with a plurality of holes therethrough, adapted to permit electrons to pass through said holes.

18. The integrated circuit electronic grid device of claim 17, wherein said fourth metal surface is adapted to collect electrons of said modulated flow of electrons.

19. The integrated circuit electronic grid device of claim 1, wherein said second metal surface comprises a metal matrix.

20. The integrated circuit electronic grid device of claim 1, wherein said dielectric medium is air.

21. The integrated circuit electronic grid device of claim 1, wherein said dielectric medium is a partial vacuum.

* * * * *